United States Patent
Hishida et al.

(10) Patent No.: US 9,171,623 B2
(45) Date of Patent: Oct. 27, 2015

(54) NON-VOLATILE SEMICONDUCTOR MEMORY DEVICE

(71) Applicant: KABUSHIKI KAISHA TOSHIBA, Tokyo (JP)

(72) Inventors: Tomoo Hishida, Kanagawa (JP); Yoshihisa Iwata, Kanagawa (JP); Yoshiaki Fukuzumi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 14/016,179

(22) Filed: Sep. 2, 2013

(65) Prior Publication Data
US 2014/0286095 A1    Sep. 25, 2014

(30) Foreign Application Priority Data
Mar. 22, 2013   (JP) .................................. 2013-060922

(51) Int. Cl.
*G11C 11/34* (2006.01)
*G11C 16/04* (2006.01)
*G11C 16/08* (2006.01)
*H01L 27/115* (2006.01)

(52) U.S. Cl.
CPC ............ *G11C 16/0483* (2013.01); *G11C 16/08* (2013.01); *H01L 27/11548* (2013.01); *H01L 27/11575* (2013.01); *H01L 27/11556* (2013.01); *H01L 27/11582* (2013.01)

(58) Field of Classification Search
USPC .......................... 365/185.05, 185.11, 185.17
See application file for complete search history.

(56) References Cited

U.S. PATENT DOCUMENTS

| | | | | |
|---|---|---|---|---|
| 8,203,882 B2 * | 6/2012 | Hishida et al. | ........... | 365/185.17 |
| 8,335,111 B2 * | 12/2012 | Fukuzumi et al. | ........ | 365/185.18 |
| 8,339,856 B2 * | 12/2012 | Iwata | ........................ | 365/185.17 |
| 8,358,539 B2 * | 1/2013 | Maeda | ..................... | 365/185.05 |
| 8,363,481 B2 * | 1/2013 | Kidoh et al. | .............. | 365/185.17 |
| 8,811,079 B2 * | 8/2014 | Fukuda et al. | ........... | 365/185.17 |
| 8,861,279 B2 * | 10/2014 | Hishida et al. | ........... | 365/185.18 |
| 8,873,299 B2 * | 10/2014 | Kaneko et al. | ........... | 365/185.11 |
| 8,947,933 B2 * | 2/2015 | Tokiwa et al. | ........... | 365/185.05 |
| 8,976,602 B2 * | 3/2015 | Shiga et al. | .............. | 365/185.17 |
| 8,982,623 B2 * | 3/2015 | Shirakawa | ............... | 365/185.11 |

OTHER PUBLICATIONS

T. Maeda et al. "Multi-stacked 1G Cell/Layer Pipe-shaped BiCS Flash Memo", Symposium on VLSI Circuits, 2009, pp. 22-23.

* cited by examiner

*Primary Examiner* — Trong Phan
(74) *Attorney, Agent, or Firm* — Patterson & Sheridan, LLP

(57) ABSTRACT

A non-volatile semiconductor memory device includes first through third memory strings, a first word line group shared by first and second memory strings and a second word line group shared by second and third memory strings, the first and second word line groups extending in a first direction and disposed adjacent to each other in a second direction that is perpendicular to the first direction. The first word line group includes laminated first word lines with each upper first word line extending in the first direction less than the first word line directly below, and the second word line group includes laminated second word lines with each upper second word line extending in the first direction less than the second word line directly below.

20 Claims, 21 Drawing Sheets

(a)

(b)

THIRD EMBODIMENT

NON-VOLATILE SEMICONDUCTOR MEMORY DEVICE

CROSS-REFERENCE TO RELATED APPLICATION

This application is based upon and claims the benefit of priority from Japanese Patent Application No. 2013-060922, filed Mar. 22, 2013, the entire contents of which are incorporated herein by reference.

FIELD

Embodiments described herein relate generally to a configuration of signal wirings from which word lines are extracted from one side.

BACKGROUND

Recently, a semiconductor memory (BiCS: Bit Cost Scalable Flash Memory) in which memory cells are laminated, has been developed. The BiCS can realize a semiconductor memory with a large capacity at a low cost.

BRIEF SUMMARY OF THE INVENTION

In general, a non-volatile semiconductor memory device includes first through third memory strings, a first word line group shared by first and second memory strings and a second word line group shared by second and third memory strings, the first and second word line groups extending in a first direction and disposed adjacent to each other in a second direction that is perpendicular to the first direction. The first word line group includes laminated first word lines with each upper first word line extending in the first direction less than the first word line directly below, and the second word line group includes laminated second word lines with each upper second word line extending in the first direction less than the second word line directly below.

DETAILED DESCRIPTION

Figure 1:
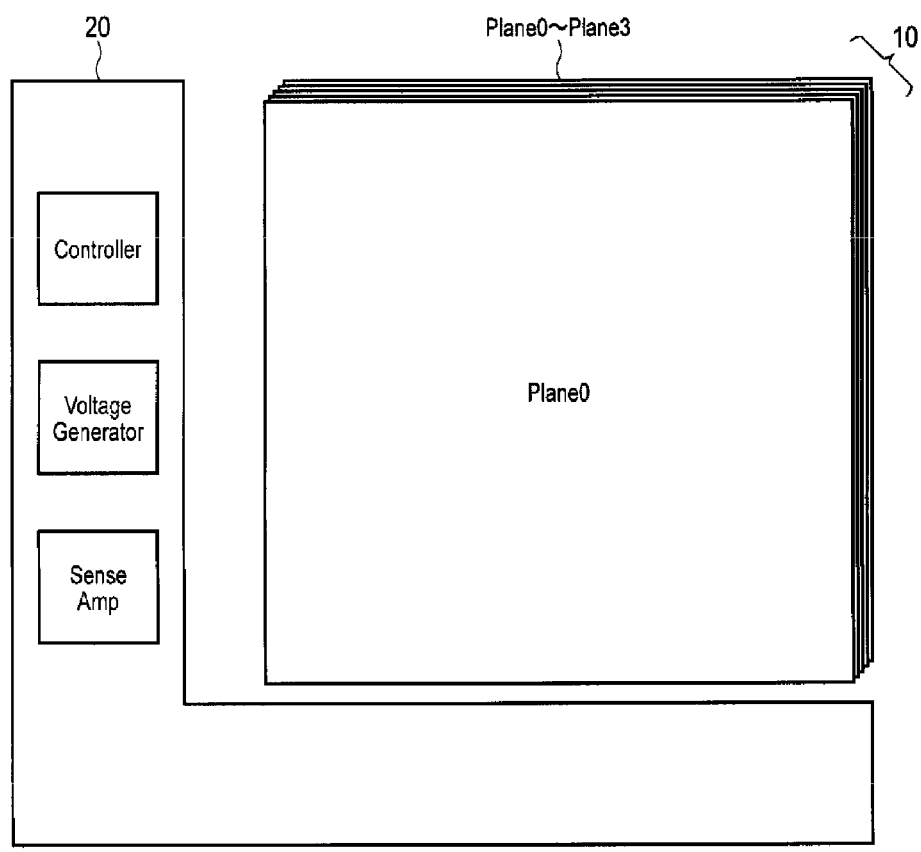
FIG. 1 is a conceptual view of a non-volatile semiconductor memory device according to a first embodiment.

Exemplary embodiments provide non-volatile semiconductor memory devices having word lines arranged so as to enable power supply connection from one side.

In general, according to one embodiment, a non-volatile semiconductor memory device includes first through third memory strings, a first word line group shared by first and second memory strings and a second word line group shared by second and third memory strings, the first and second word line groups extending in a first direction and disposed adjacent to each other in a second direction that is perpendicular to the first direction. The first word line group includes laminated first word lines with each upper first word line extending in the first direction less than the first word line directly below, and the second word line group includes laminated second word lines with each upper second word line extending in the first direction less than the second word line directly below.

Hereinafter, exemplary embodiments will be described referring to the drawings. In the description, like components are denoted by like reference numerals across all drawings. However, it should be noted that the drawing are schematic, and the relationships between thicknesses and planar dimensions and the ratios between thicknesses of respective layers and the like are different from the actual ones. Accordingly, specific thicknesses and dimensions should be understood in the context of the description below. Further, portions are included in which dimensional relationships and ratios differ across the drawings.

A non-volatile semiconductor memory device according to the exemplary embodiment provides signal wirings that are electrically connected to word lines WL from one side, thereby reducing a size of a power supply circuit that supplies voltages to the word lines WL.

Further, the non-volatile semiconductor memory device provides the signal wirings using a variety of layers, thereby reducing a width of one block BLK. As a result, this enables to reduce a block size.

First Embodiment

FIG. 1 illustrates an overall configuration example of a non-volatile semiconductor memory device according to a first embodiment.

1. Configuration Example

As shown in FIG. 1, the non-volatile semiconductor memory device of the first embodiment is configured with memory cell arrays 10 (in FIG. 1, for example, Plane0 to Plane3), and peripheral circuit 20 capable of controlling the memory cell arrays 10. The memory cell arrays 10 and the peripheral circuit 20 are electrically connected through signal wirings that will be described later.

1.1 Regarding Plane0 to Plane3

Each of Plane0 to Plane3 includes a plurality of memory cells MC capable of holding data. The memory cell MC is formed in a direction normal to a semiconductor substrate. That is, memory cells of Plane0 to Plane3 have a laminated type structure.

A configuration of the memory cell arrays 10 is described, for example, in U.S. patent application Ser. No. 12/407,403 filed on Mar. 19, 2009 entitled "a three-dimensional laminated non-volatile semiconductor memory." Further, the configuration of the memory cell array 10 is described in U.S. patent application Ser. No. 12/406,524 filed on Mar. 18, 2009 entitled "a three-dimensional laminated non-volatile semiconductor memory", U.S. patent application Ser. No. 12/679,991 filed on Mar. 25, 2010 entitled "a non-volatile semiconductor memory device and a manufacturing method thereof", and U.S. patent application Ser. No. 12/532,030 filed on Mar. 23, 2009 entitled "a semiconductor memory and a manufacturing method thereof." These patent applications are incorporated in this specification by reference in its entirety.

1.2 Regarding Peripheral Circuit 20

The peripheral circuit 20 includes a controller, a voltage generating circuit, and a functional portion such as a sense amplifier. The functional portion is configured with a variety of MOS transistors, signal lines which supply voltages to the transistors and contact plugs CP. In addition, the MOS transistors, the signal lines, and the contact plugs CP are arranged immediately below the memory cell arrays 10.

The controller controls all memory regions, that is, Plane0 to Plane3. The voltage generating circuit outputs a variety of voltages required for writing, reading, or erasing of data. The sense amplifier performs writing, reading, or the like of data.

2.1 Regarding Detailed Description of Plane0 to Plane3

2.1.1 Regarding Plan View

Figure 2:
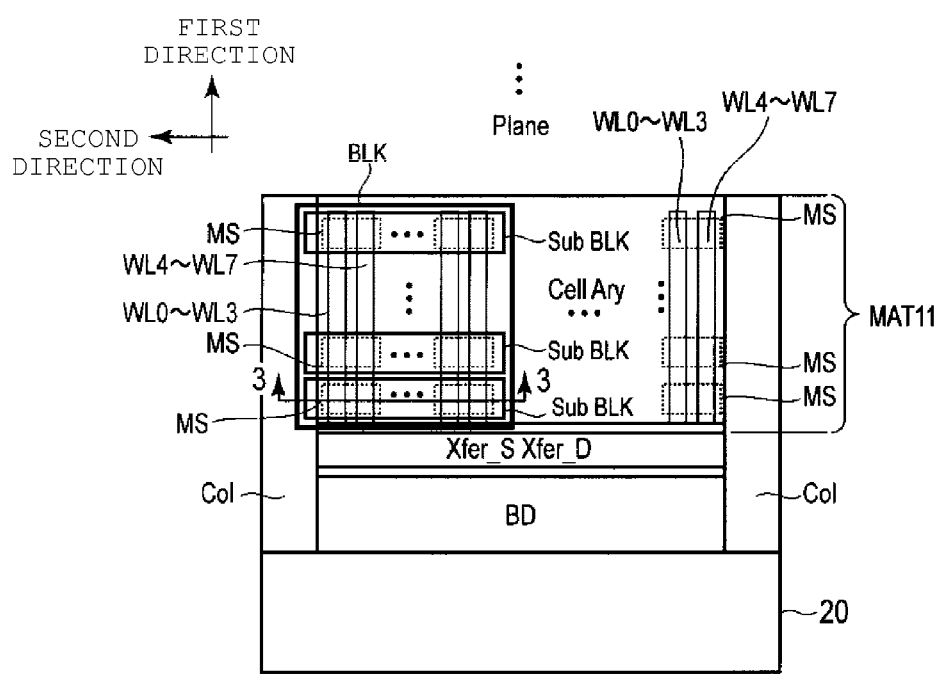
FIG. 2 is a conceptual view of one plane of memory cells and a peripheral circuit of the non-volatile semiconductor memory according to the first embodiment.

Next, FIG. 2 illustrates, for example, a plan view (top view) of Plane0 and the peripheral circuit 20. In addition, since configurations of Plane1 to Plane3 are the same as the configuration of Plane0, the description thereof will be omitted.

As shown in FIG. 2, Plane0 includes MAT11, XFER_S, XFER_D, column decoders COL (in FIG. 2, COL) and a block decoder BD (in FIG. 2, BD).

MAT11 is configured with a plurality of memory cells MC. To be more specific, as shown in FIG. 2, the memory cells MC are connected to form a memory string MS (in FIG. 2, referred to as MS).

Next, for example, a plurality (for example, twelve memory strings MS) of the memory strings MS constitutes a sub block BLK. Further, a plurality of the sub blocks constitutes a block BLK, and a plurality of blocks BLK forms MAT11.

Word lines WL0 to WL3 (hereinafter, referred to as a first signal line group) and word lines WL4 to WL7 (hereinafter, referred to as a second signal line group) are formed in a first direction, and semiconductor layers SC, that will be described later, each of which is formed to pass through each memory string MS in a paper depth direction. The memory cells MC are formed at intersections of the word lines WL and the semiconductor layers SC.

In addition, a plurality of bit lines BL, not shown, are formed in a second direction. As shown, XFER_D and XFER_S are arranged, for example, on a peripheral circuit 20 side of MAT11. One ends of the word lines WL0 to WL3 are connected to XFER_S, and one ends of word lines WL4 to WL7 are connected to XFER_D. In this manner, a first signal group and a second signal group are extracted from the same direction in the exemplary embodiment.

In addition, XFER_D and XFER_S are configured with a plurality of MOS transistors by which anyone of memory strings MS within any one of blocks BLK constituting MAT11 can be selected. Specifically, when a control signal is received from the block decoder BD, a memory string MS that is an object of reading and writing may be selected.

The block decoder BD switches ON and OFF the MOS transistors located in XFER_S and XFER_D, to thereby select a memory string MS that is an object of reading and writing among a plurality of memory strings MS.

The column decoder COL selects a bit line BL, not shown.

2.1.2 Regarding Cross-Sectional View

Next, the cross-sectional view of the blocks BLK constituting Plane0 will be described using FIG. 3.

Figure 3:
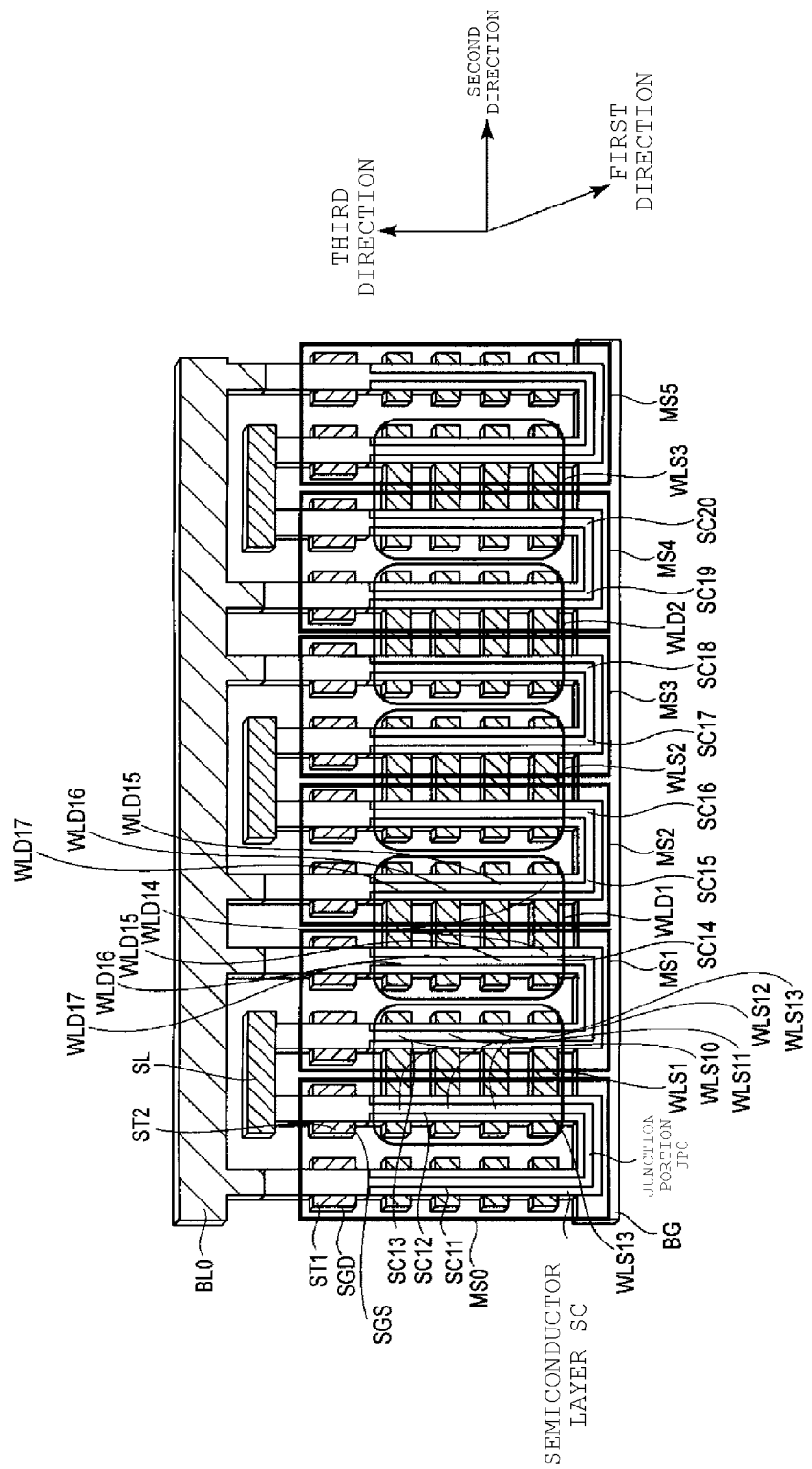
FIG. 3 is a perspective view of memory cell arrays and signal wirings according to the first embodiment.

FIG. 3 is a cross-sectional view taken along 3-3 line in FIG. 2. Here, the memory strings MS0 to MS4 connected to the bit line BL0 are described as an example.

2.1.2.1 Regarding Memory String MS0 to MS4

As shown, the memory strings MS0 to MS4 (thick frame) are provided along the cross-sectional direction. Each of the memory strings MS has semiconductor layers SC, a junction portion JP, word lines WL, and selection transistors ST1 and ST2. Hereinafter, each component will be described.

Column-like semiconductor layers SC11 to SC20 are formed on a semiconductor layer BG in a third direction which is orthogonal to each of the first direction and the second direction. Hereinafter, the semiconductor layers SC11 to SC20 are simply referred to as semiconductor layers SC.

Further, the semiconductor layers SC that are adjacent to each other along the second direction are joined through the junction portion JP that is formed within the semiconductor layer BG. For example, the semiconductor layers SC11 and SC12 are joined through the junction portion JP0 within the semiconductor layer BG. A memory string MS0 having a U shape is formed with such a configuration.

In addition, for example, a pair of semiconductor layers SC13 and SC14, a pair of semiconductor layers SC15 and SC16, a pair of semiconductor layers SC17 and SC18, and a pair of semiconductor layers SC19 and SC20 have the same configuration as the above, and thus the description thereof will be omitted.

Further, a plurality of polysilicon layers that are formed along the third direction are provided within each memory string MS. Some polysilicon layers function as word lines WL but other polysilicon layers function as selection signal lines SGS and SGD.

The selection signal lines SGS and SGD are provided with the word lines WL interposed therebetween. In other words, as shown in FIG. 3, if the number of word lines WL is set to 4, starting from the selection signal line SGD, the word lines WL7 to WL4 are provided along the semiconductor layer SC11 from the top, and the word lines WL3 to WL0 and selection signal lines SGS are provided along the semiconductor layer SC12 in this order from the bottom.

Accordingly, the selection transistor ST1, a memory cell MC7, a memory cell MC6, . . . , a memory cell MC1, a memory cell MC0, and the selection transistor ST2 are provided at the intersections between the semiconductor layers SC and the selection signal lines SGS and SGD, and word line WL.

In addition, the selection signal lines SGS and SGD function as selection signal lines SGS and SGD which control selection and non-selection of the memory strings MS.

In addition, a hierarchy (hereinafter, referred to as a layer) in which selection transistors ST1 and ST2 are formed is referred to as an SG layer. The SG layer is located below a D0 layer that will be described later.

Then, as shown in FIG. 3, the word lines WL to be laminated are separately formed between the semiconductor layers SC11 and SC12 that are arranged adjacent to each other, between semiconductor layers SC13 and SC14 that are arranged adjacent to each other, between semiconductor layers SC15 and SC16 that are arranged adjacent to each other, and between semiconductor layers SC17 and SC18 that are arranged adjacent to each other. However, the word lines WL may be commonly connected between the semiconductor layers SC12 and SC13, between the semiconductor layers SC14 and SC15, between the semiconductor layers SC16 and SC17, and between the semiconductor layers SC18 and SC19.

Hereinafter, respective word lines WL that are commonly connected between the semiconductor layers SC12 and SC13 is referred to as word lines WLS1 (in FIG. 3, a thick frame) as necessary, and respective word lines WL that are commonly connected between the semiconductor layers SC14 and SC15 is referred to as word lines WLD1 (in FIG. 3, a thick frame) as necessary.

In the same manner, respective word lines WL that are commonly connected between the semiconductor layers SC16 and SC17 and between the semiconductor layers SC18 and SC19 are respectively referred to as word lines WLS2 (in FIG. 3, a thick frame) and word lines WLD2 (in FIG. 3, a thick frame) as necessary.

2.1.2.2 Regarding Bit Lines BL and Source Lines SL

One ends of the semiconductor layer SC11 and semiconductor layer SC14 that pass through the selection signal lines SGD and SGD, one ends of the semiconductor layer SC15 and semiconductor layer SC18 that pass through the selection signal lines SGD and SGD, and one end of the semiconductor layer SC19 that passes through the selection signal line SGD are respectively and commonly connected in a bit line BL0. The layer in which the bit line BL0 is formed will be referred to as a D1 layer below.

In addition, ends of the semiconductor layers SC12 and SC13 that pass through the selection signal lines SGS and SGS, ends of the semiconductor layers SC16 and SC17 that pass through the selection signal lines SGS and SGS, and one end of the semiconductor layer SC20 that passes through the selection signal line SGS are respectively connected to the source lines SL. In other words, for example, the semiconductor layers SC12 and SC13 that are adjacent to each other, and the semiconductor layers SC14 and SC15 that are adja-cent to each other are commonly connected to the source lines SL. The layer in which the source lines SL is formed is referred to as the D0 layer.

Then, with regard to a relationship among the SG layer, the D0 layer and D1 layer, it is established that SG layer 21 D0 layer<D1 layer in the third direction from the bottom.

2.1.2.3 Bit Lines BL1 to BLm-1

The foregoing is focused on a bit line BL0, same configuration is applied to the bit lines BL1 to BLm-1.

In other words, the semiconductor layers SC connected to bit lines BLi (i: natural number, 1≤i≤m−1) are set to semiconductor layers SCi1 to SC (i+10). In this case, since the selection signal lines SGS, word lines WL0 to WL7, and selection signal lines SGD pass through the semiconductor layers SCi1 to SC(i+10), a plurality of memory strings MS are formed so as to correspond to each bit line BLi.

In addition, in each memory strings MS corresponding to the bit line BLi, the semiconductor layers SCi2 and SCi3 that are adjacent to each other and the semiconductor layers SCi4 and SCi5 that are adjacent to each other are respectively and commonly connected to the source lines SL.

Here, a case in which each memory string MS is configured with memory cells MC0 to MC7 and selection transistors ST1 and ST2 is described as an example, but the number of memory cells MC is not limited. In other words, the number of memory cells MC may be 16 or 32. Hereinafter, the number of memory cells MC is assumed to be s (s: natural number) as necessary.

In this manner, PlaneP0 is configured by arranging memory cells MC which electrically stores data in a three-dimensional matrix shape. That is, the memory cells MC are arranged in the laminated direction and also arranged in a horizontal direction perpendicular to the laminated direction in a matrix shape. In this manner, a plurality of memory cells MC that are laminated in the laminated direction are serially connected, and the memory string MS is configured with a plurality of memory cells MC that are serially connected to each other.

2.2 Regarding Perspective View of MAT11

Figure 4:
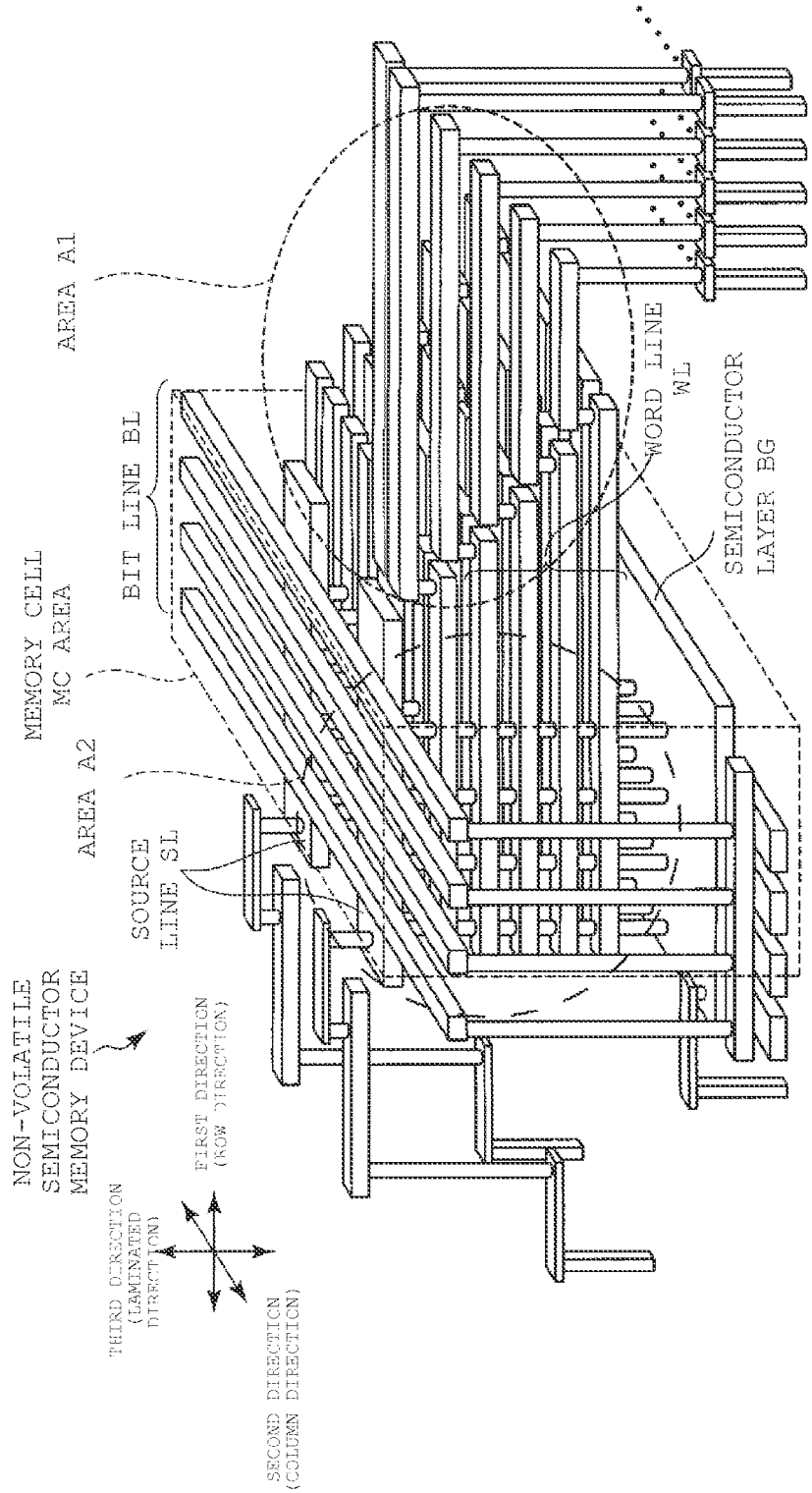
FIG. 4 is a cross-sectional view of a sub block according to the first embodiment.

Next, FIG. 4 illustrates a perspective view of MAT11 and the signal wirings in the vicinity of MAT11 that are shown in FIG. 2. As described above, a plurality of memory cells MC are formed in MAT11, and the signal wirings to which the memory cells MC and external devices are electrically connected are formed in the vicinity of MAT11.

An area in which the memory cells MC are formed is set as area A1, and an area in which the signal wirings are formed is set as area A2.

Hereinafter, a method of extracting wirings in the area A2 will be described.

3. Regarding Extraction of Signal Wirings

A method of extracting the signal wirings will be described using FIGS. 5(a) and 5(b), and FIG. 6. FIGS. 5(a) and 5(b) correspond to a case in which the number n of the laminated layers of the word lines WL is 4 layers, and FIG. 6 corresponds to a case in which the number n of the laminated layers of the word lines WL is 8 layers. FIG. 5(b) is a cross-sectional view taken along 5-5' line in FIG. 5(a).

3.1 Case where n=4 Layers

Figure 5:
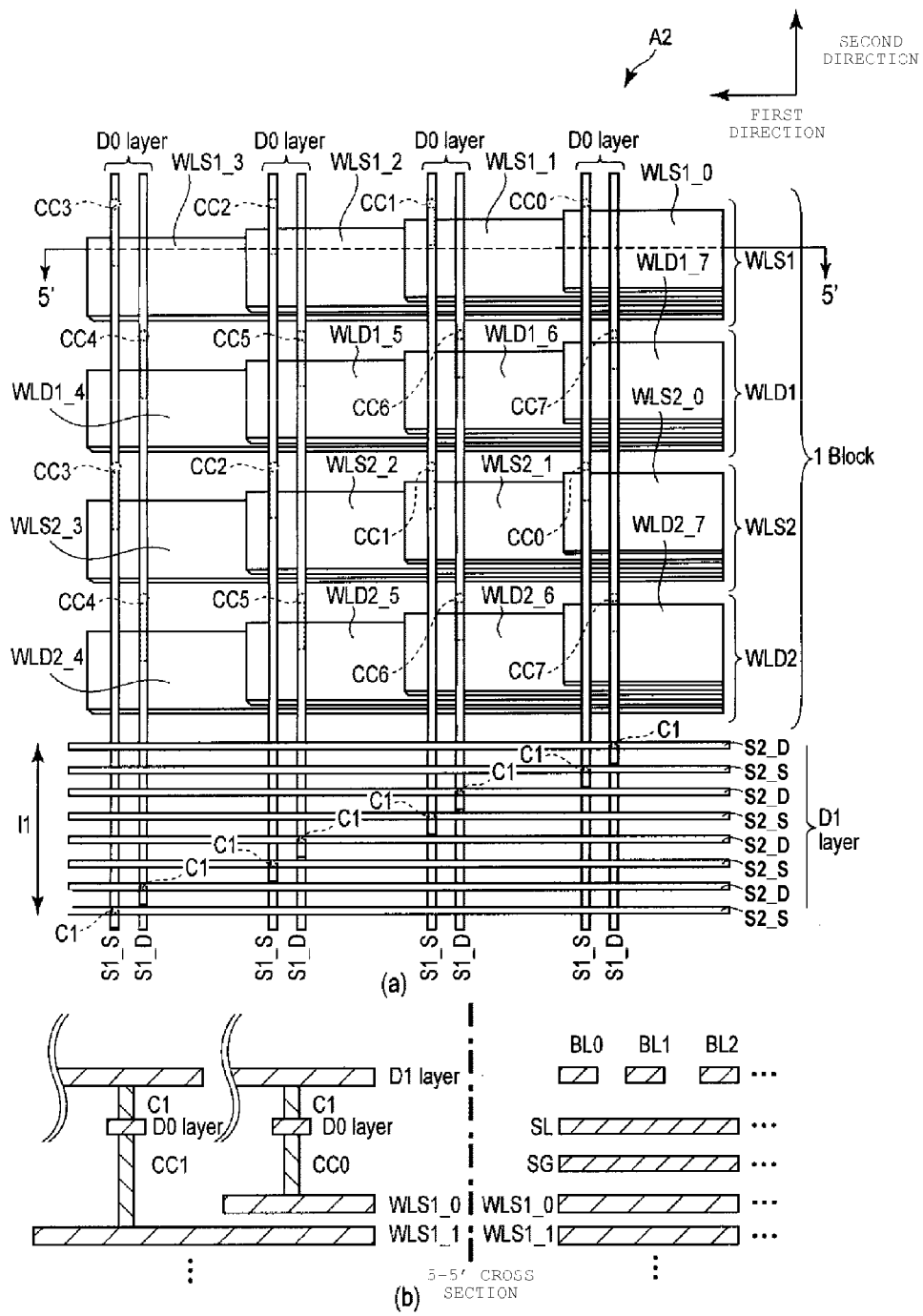
FIG. 5($a$) is a perspective view illustrating a configuration of the signal wirings according to the first embodiment when the number of layers n is 4, and FIG. 5($b$) is a cross-sectional view of the signal wirings shown in FIG. 5($a$).

FIG. 5 (a) illustrates a conceptual view in which the word lines WLS1, WLD1, WLS2, and WLD2 are arranged on one side in the first direction. FIG. 5(b) is a cross-sectional view of the word lines WLS in FIG. 5(a).

As shown in FIG. 5(a), the word line WLS1 is configured with word lines WLS1_3, WLS1_2, WLS1_1, and WLS1_0 (corresponding to word lines WL3 to WL0) in that order from a lower layer.

In the same manner, the word line WLS2 is configured with word lines WLS2_3, WLS2_2, WLS2_1, and WLS2_0 (corresponding to word lines WL3 to WL0) in that order from the lower layer.

Further, the word line WLD1 is configured with word lines WLD1_4, WLD1_5, WLD1_6, and WLD1_7 (corresponding to word lines WL4 to WL7) in that order from the lower layer.

In the same manner, the word line WLD2 is configured with word lines WLD2_4, WLD2_5, WLD2_6, and WLD2_7 (corresponding to word lines WL4 to WL7) in that order from the lower layer.

Hereafter, WLS1 and WLS2, WLD1 and WLD2 are simply referred to as WLS and WLD, respectively.

3.1.1 Regarding Word Line WLS1 and Word Line WLS2

As shown in FIG. 5(a), the word lines WLS1 and WLS2 are configured in a staircase shape of 4 layers.

In addition, as shown in FIGS. 5 (a) and 5(b), the contact plugs CC0 to CC3 are respectively formed on WLS1_0 to WLS1_3 and WLS2_0 to WLS2_3 respectively constituting word lines WLS1 and WLS2.

For example, as shown in FIG. 5(b), the upper ends of the contact plugs CC0 to CC3 are arranged in the upper layer (D0 layer: the same height as SL), and are connected to the signal wirings S1_S that are formed to extend in the second direction. That is, the signal wirings S1_S are wirings which connect the word line WLS1 or WLS2, and the signal wirings S2 that will be described later, through the contact plugs CC0 to CC3.

Further, the lower ends of the contact plugs C1 are connected above the signal wirings S1_S, and four (equal to the number of laminated layers) signal wirings S2_S which extend in the first direction are formed in the upper ends of the contact plugs C1. The signal wirings S2_S are arranged at the height of the D1 layer (BL).

3.1.2 Regarding Word Line WLD1 and Word Line WLD2

The word lines WLD1 and WLD2 are configured in a staircase shape of 4 layers, and contact plugs CC4 to CC7 are respectively formed on WLD1_4 to WLS1_7 and WLD2_4 to WLS2_7 which constitute the word lines WLD1 and WLD2.

Next, the upper ends of the contact plug CC4 to CC7 are connected to the signal wirings S1_D. The signal wirings S1_D are arranged to be adjacent to the signal wirings S1_S, and formed to extend in the second direction.

Further, the contact plugs C1 are formed in the signal wirings S1_D, and four (equal to the number of laminated layers) signal wirings S2_D that are arranged to be adjacent to the signal wirings S2_S are formed in the upper end of the contact plugs C1.

In 3.1.1 and 3.1.2, the position of the signal wirings S2_S and the signal wirings S2_D are illustrated in the front part of the drawings as being shifted, but there is no shift in a real configuration. That is, the signal wirings S2_S and the signal wirings S2_D are arranged above the word line WLS and the word line WLD.

3.1.3 Regarding Width of D1 Layer

As described above, if n=4 layers, a total of eight signal wirings S2 are provided. In a case where the signal wirings S2 are arranged at predetermined intervals, the width becomes $l_1$ (in FIG. 5).

3.2 Case where n=8 Layers

Next, the extracting of the signal wirings S1 and S2 if n=8 will be described using FIG. 6. However, in this case, only the number of layers is increased, and a basic connection scheme is the same as the pattern, and thus the description regarding the same components will be omitted.

Figure 6:
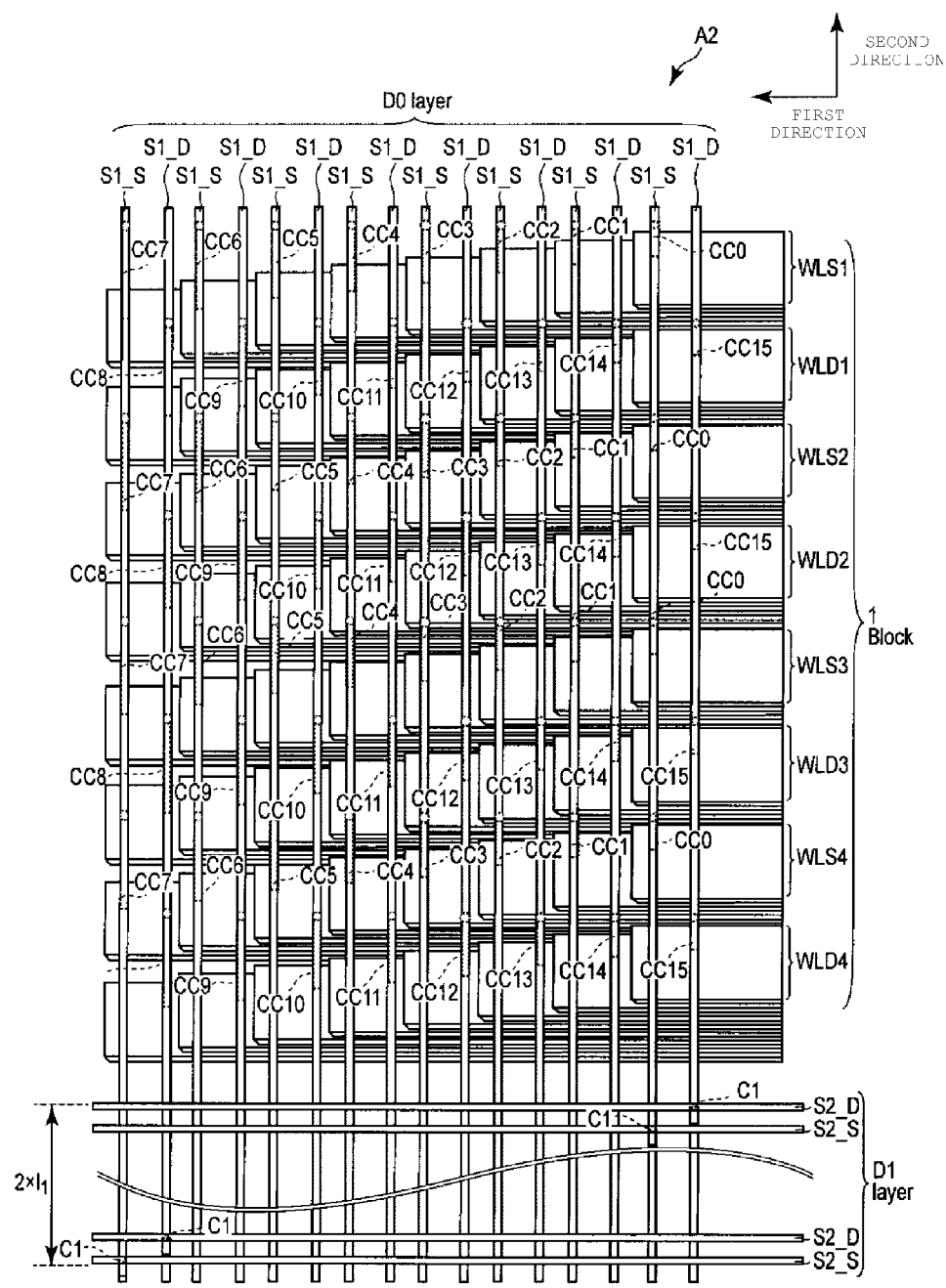
FIG. 6 is a perspective view illustrating a configuration of the signal wirings according to the first embodiment when n is 8.

FIG. 6 is a conceptual view illustrating word lines WLS1 to WLS4 and WLD1 to WLD4 that are arranged on one side along the first direction.

As shown, since the number n of the laminated layer number is 8, the word lines WL7 to WL0 constituting each of the word lines WLS1 to WLS4 are referred to as WLS1_7, WLS1_6, ..., WLS1_0, WLS2_7, WLS2_6, ..., WLS2_0, WLS3_7, WLS3_6, ..., WLS3_0, WLS4_7, WLS4_6, ..., and WLS4_0 from the lower layer.

Further, the word lines WL8 to WL15 constituting each of the word lines WLD1 to WLD4 are referred to as WLD1_8, WLD1_9, WLD1_15, WLD2_8, WLD2_9, ..., WLD2_15, WLD3_8, WLD3_9, ..., WLD3_15, WLD4_8, WLD4_9, ..., and WLD4_15 from the lower layer.

In addition, WLS1 to WLS4 and WLD1 to WLD4 are simply referred to as WLS and WLD.

3.2.1 Regarding Word Line WLS1 to Word Line WLS4

The contact plugs CC0 to CC7 are connected to above WLS1_0 to WLS1_7, WLS2_0 to WLS2_7, WLS3_0 to WLS3_7, and WLS4_0 to WLS4_7, respectively, and the word lines WLS1 to WLS4 are commonly connected by the signal wirings S1_S connected to each of the contact plugs CC0 to CC7.

In addition, since the signal wirings S2_S have the same pattern as the pattern described above, the description thereof will be omitted.

3.2.2 Regarding Word Line WLD1 to Word Line WLD4

The contact plugs CC8 to CC15 are connected above WLD1_0 to WLD1_7, WLD2_0 to WLD2_7, WLD3_0 to WLD3_7, and WLD4_0 to WLD4_7 respectively constituting the word lines WLD1 to WLD4, and the word lines WLD1 to WLD4 are commonly connected by the signal wirings S1_D connected to each of the contact plugs CC8 to CC15.

In addition, since the signal wirings S2_D provided in the D1 layer has the same pattern as the pattern of FIG. 5, the description thereof will be omitted.

Further, similar to 3.1.1 and 3.1.2, even in 3.2.1 and 3.2.2, the signal wirings S2_S and the signal wirings S2_D are located immediately above the word lines WLS and the word lines WLD.

Further, if n=8 layers, in total 16 signal wirings S2 are provided. When these signal wirings S2 are arranged at predetermined intervals, the width becomes $2 \times l_1$ (in FIG. 6).

4. Regarding Block BLK Size 4.1 Regarding the Case where the Number n of the Laminated Layers is 4 (n=4)

Figure 7:
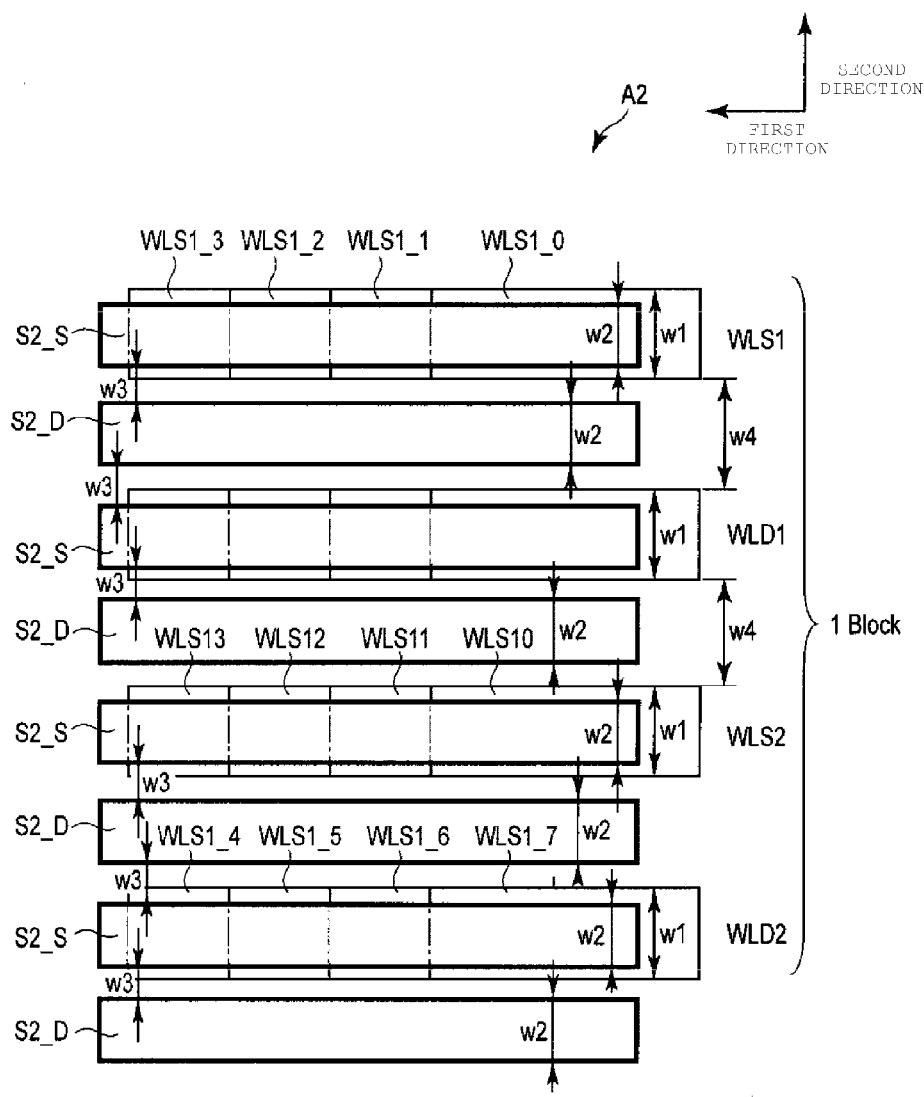
FIG. 7 is a plan view illustrating the signal wirings according to the first embodiment when n is 4.

Next, if the number n of the laminated layers is 4 (n=4), a size of a block BLK will be described using FIG. 7. FIG. 7 is a plan view of FIG. 5. That is, one block (1 block) in FIG. 7 corresponds to one block (1 block) in FIG. 5. Further, WLS 10 and WLS 11 in FIG. 7 correspond to WLS 10 and WLS 11 in FIG. 3.

As shown in FIG. 7, the line widths of the word lines WLS and the word lines WLD are set to width w1, and the line widths of the signal wirings S2_S and S2_D are set to width w2. In addition, the distance between the word lines WLS and the word lines WLD is set to w4, and the distance between the signal wirings S2_S and S2_D is set to w3.

Here, a relationship of $w1 < 2 \times w2 + w3 < w1 + w4$ is established among w1, w2, w3 and w4.

If the above relationship is established, as shown in FIG. 7, one signal wiring S2_S having the width w2 passes through above the word line WL having the width w1, and one signal wiring S2_D passes through between the word line WLS and the word line WLD adjacent thereto. Here, the signal wirings S2 are manufactured to have a minimum feature size.

In this manner, since only one of the signal wirings S2 can pass through above each one of the word lines WLS and each area between the word lines WLS and the adjacent word lines WLD, if the number n of the laminated layers is 4 (n=4), the size of the block BLK becomes a unit formed of word lines WLS1, WLS2, WLD1, and WDL2 as shown in FIG. 7.

4.2 Regarding Case where the Number n of the Laminated Layers is 8 (n=8)

Figure 8:
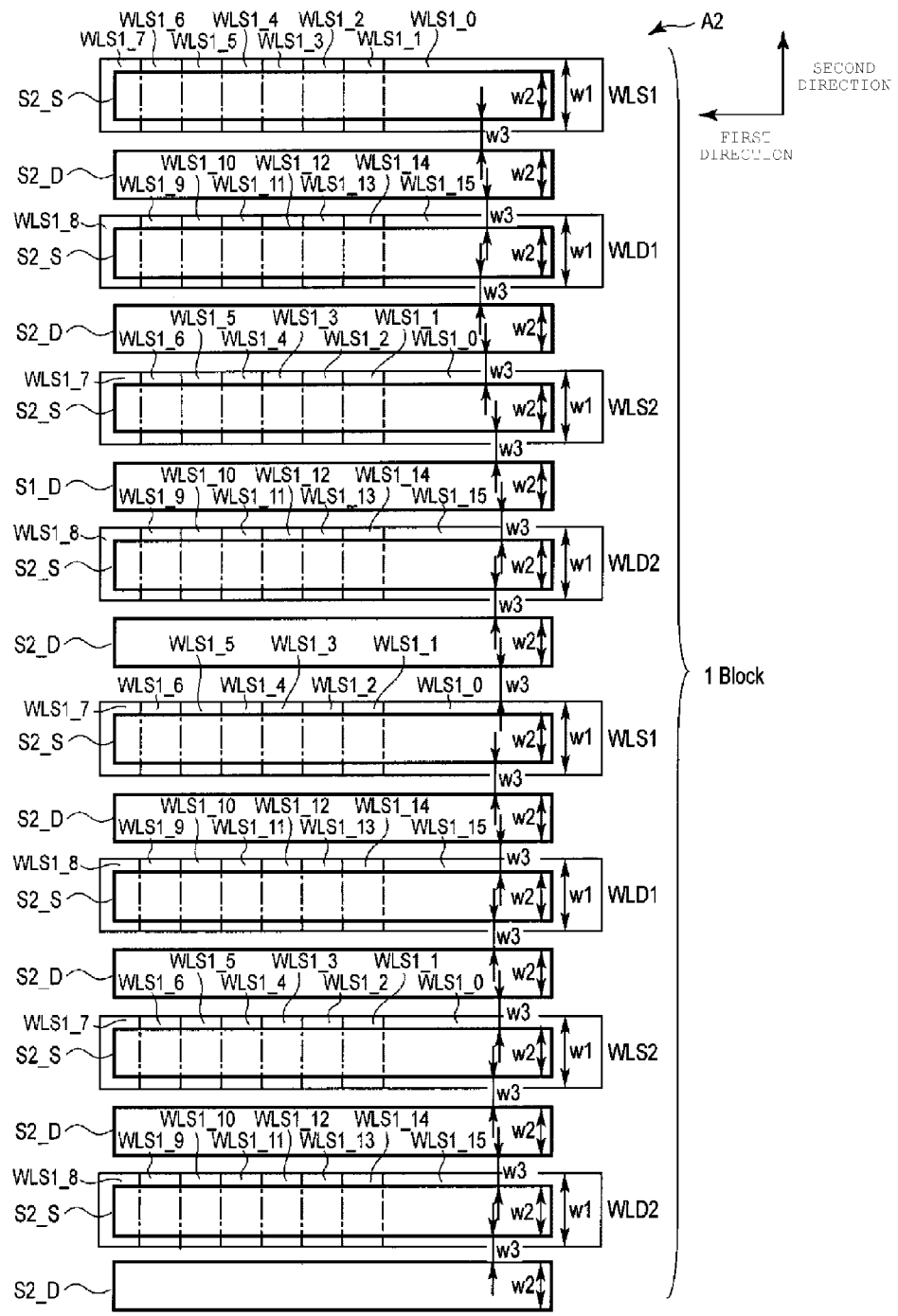
FIG. 8 is a plan view illustrating the signal wirings according to the first embodiment when n is 8.

Next, if the number n of the laminated layer is 8 (n=8), the size of the block BLK will be described using FIG. 8. FIG. 8 is a plan view of FIG. 6. That is, one block (1 block) in FIG. 8 corresponds to one block (1 block) in FIG. 6. In FIG. 8, WLS1 includes WLS 1 through WLS7, and WLD1 includes WLS 9 through WLS 15. WLS2 and WLD2 include WLSs similarly WLS1 and WLD1, respectively.

As described above, since only one of the signal wirings S2 can pass through above each one of the word lines WLS and each area between the word lines WLS and the adjacent word lines WLD, if the number n of the laminated layers is 8 (n=8), the size of the block BLK becomes a unit formed of word lines WLS1 to WLS4, and WLD1 to WDL4. In other words, if the number of the laminated layers is doubled, the block width becomes double, and thus arranging the word lines from one side becomes possible.

Effects According to the First Embodiment

In the non-volatile semiconductor device according to the first embodiment, the following effects (1) and (2) can be achieved.

(1) It is possible to reduce a circuit area.

That is, in the non-volatile semiconductor device according to the exemplary embodiment, the word lines WLS and the word lines WLD are arranged on one side of the memory cell array 10. Therefore, the power supply circuit that supplies voltages to the word lines WL can be arranged in one place.

With respect to the above example, memory cell arrays 10 in which the word lines WL are arranged in a comb shape will be explained as a comparative example. In addition, the same components will be denoted by the same reference numerals.

In a case of the comparative example, since the word lines WLS are arranged on one side of the memory cell array 10 and then the word lines WLD are arranged on the other side thereof, the power supply circuits for the word lines WL are provided at both ends of the memory cell array 10.

If a plurality of memory cell arrays 10 are provided, the power supply circuits of (the number of memory cell arrays 10×2) becomes necessary. Therefore, a circuit area becomes necessary which corresponds to the area of the power supply circuits.

Therefore, in the semiconductor memory device according to the first embodiment, the area of the power supply circuit can be reduced. For example, the word lines WLS are arranged on one side while the word lines WLS1 and WLS2 are not shared, and then the word lines WLS1 and WLS2 are shared using the contact plugs CP and the signal wirings S at a place where they are extended. The same configuration is applied to the word lines WLD1 and WLD2.

In this manner, in the non-volatile semiconductor device according to the exemplary embodiment, it is preferable that the power supply circuits of the same number as the number of the memory cell arrays 10 be provided. Since an extra power supply circuit like the comparative example is not needed, the circuit area can be reduced corresponding to the extra power supply.

(2) It is possible to reduce a circuit area.

In the non-volatile semiconductor device according to the exemplary embodiment, the word lines WLS and the word lines WLD are arranged on one side of the memory cell array 10. That is, an area for arranging located on the other side that is originally exemplary becomes unnecessary. Therefore, the circuit area can be reduced corresponding to the area on the other side.

Second Embodiment

Next, a second embodiment will be described using FIGS. 9 to 18. In the semiconductor memory device according to the second embodiment, for example, the lengths of the word lines WLD and the lengths of the word lines WLS are different from each other.

In other words, the leading end portions of the word lines WLS are located in front of the leading end portions of the word lines WLD, thereby the word lines WLS and the word lines WLD are arranged differently from each other. In addition, the positions of the word lines WLS may be opposite to the positions of the word lines WLD.

This reduces the size of the block BLK (hereinafter, the width of the block BLK may be indicated) while pitches between the signal wirings S2 are widened.

1. Regarding Extraction of Signal Wirings

Figure 9:
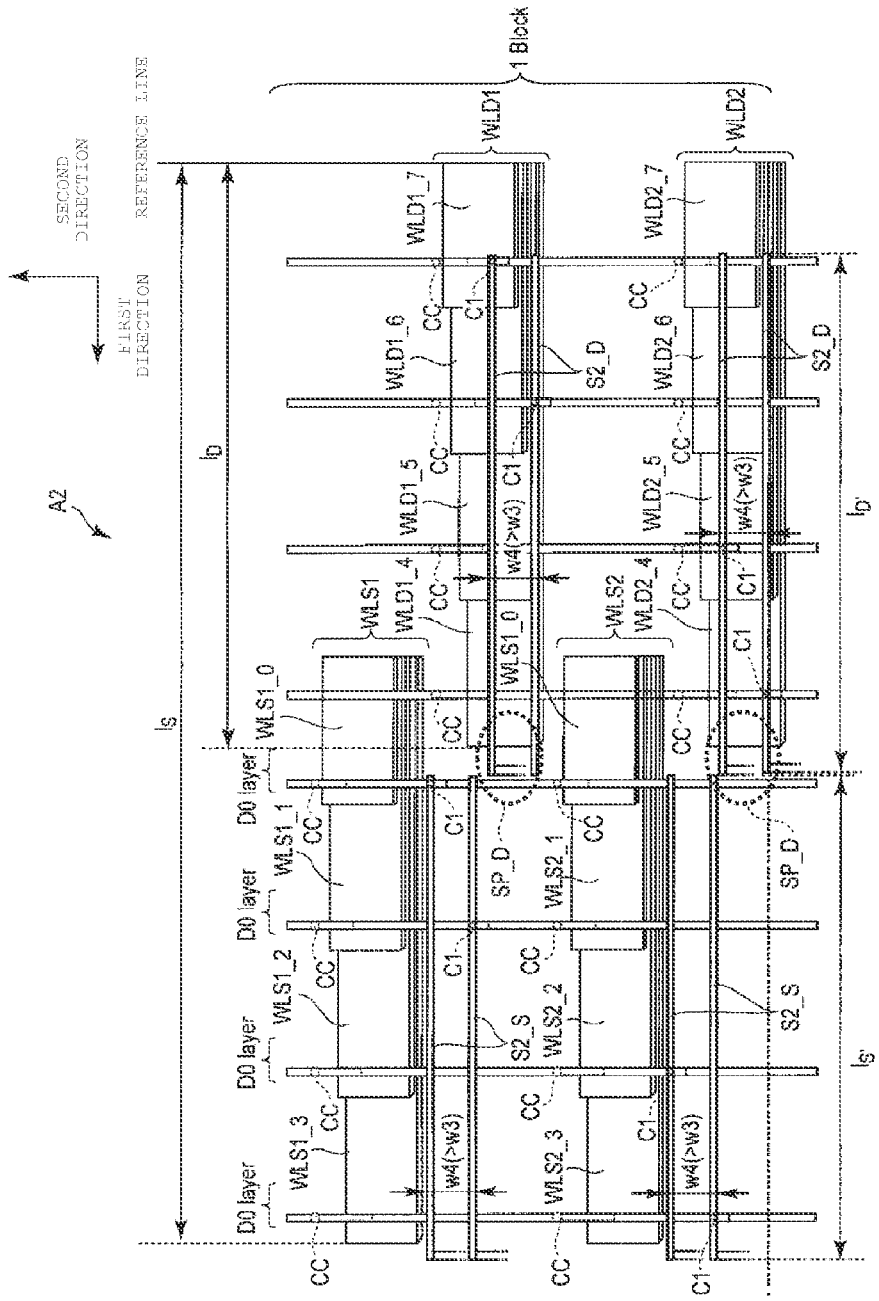
FIG. 9 is a perspective view illustrating signal wirings according to a second embodiment when n is 4.
Figure 10:
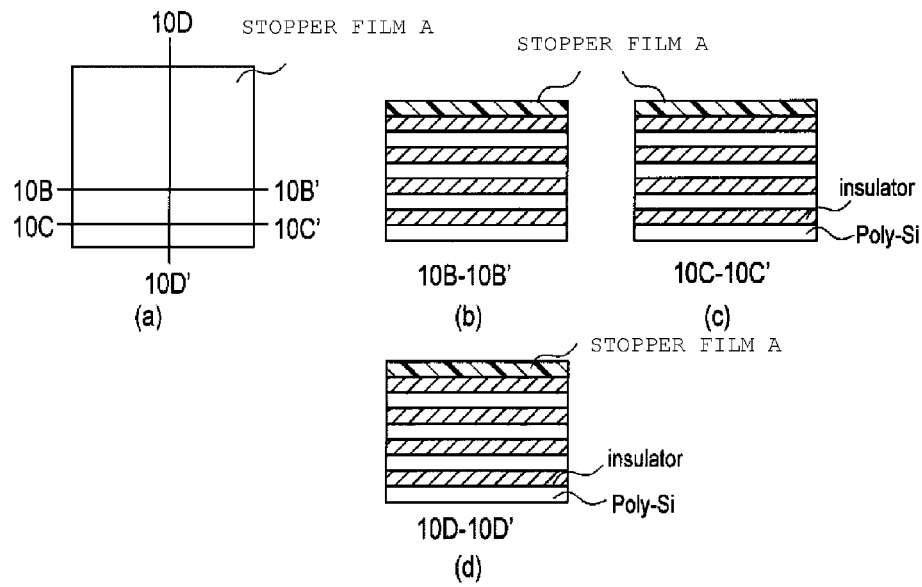
FIGS. 10($a$)-10($d$) illustrate a first manufacturing step of word lines according to the second embodiment.

FIG. 9 is a perspective view focused on an area A2 of one block, and is a conceptual view in which the word lines WLS1, WLD1, WLS2, and WLD2 are arranged on one side along the first direction. In addition, the description regarding the same configurations as the first embodiment will be omitted.

1.1 Case where n=4

As shown in FIG. 9, from a reference line in the first direction, the distance to the word lines WLS is set to a length $l_S$, and the distance to the word lines WLD is set to a length $l_D$ ($<l_S$). In this manner, the word lines WLS and the word lines WLD are differently arranged.

1.1.1 Regarding Signal Wirings S2_D

As described above, a relationship of $l_D<l_S$ is established between the word lines WLS and the word lines WLD. For this reason, as shown in FIG. 9, spaces occur at the leading ends of the word lines WLD. Hereinafter, the spaces are referred to as "space SP_D."

The spaces SP_D are areas in which the contact plugs and the like are arranged that connect the one ends of the signal wirings S2_D and the MOS transistor of the lower layer. In this manner, if the leading ends of the signal wirings S2_D extend to the spaces SP_D, it becomes connectable to the MOS transistor and the like of the lower layer using the space SP_D. Here, the distance from the one ends of the signal wirings S2_D to the other ends thereof is set to a length $l_{D'}$.

Further, an interval between the adjacent signal wirings S2_S along the second direction is set to a width w4. The width w4 is set to be larger than w3 that is a width between the adjacent signal wirings S2_S and the signal wirings S2_D in FIGS. 7 and 8 according to the first embodiment. That is, the relationship w4>w3 is established.

1.1.2 Regarding Signal Wirings S2_S

As shown in FIG. 9, the signal wirings S2_S are arranged in front of the portion in which the signal wirings S2_D are ended. That is because the signal wirings S2_S and the signal wirings S2_D are arranged to be overlapped along the second direction. It is based on a fact that the signal wirings S2_S are arranged to be overlapped with the signal wirings S2_D as much as possible, thereby it is possible to reduce the size of a block.

Here, a distance from the one ends of the signal wirings S2_S to the other end thereof are set to $l_{S'}$. In addition, if the end points of the signal wirings S2_D extend to the space SP_D, a relationship of $L_{D'}=l_{S'}$, $L_{D'}>L_{S'}$, or $L_{D'}<l_{S'}$ is established between $L_{D'}$ and $l_{S'}$.

Further, an interval between the adjacent signal wirings S2_D along the second direction is set to the same as the width w4.

In addition, when the signal wirings S2_S and the signal wirings S2_D are arranged to be overlapped with each other in the second direction in terms of their positional relationship, it is possible to reduce the size of a block. At this time, the length $L_2$ shown in FIG. 9 becomes the minimum. In addition, even in this case, the spaces SP_D are provided.

2. Manufacturing Method

Next, using FIGS. 10(a)-(d) through in FIGS. 18(a)-(d), a manufacturing process of a semiconductor memory device according to the second embodiment (the number n of the laminated layers is 4 (n=4)) will be described.

FIG. 10(a) to FIG. 18(a) show plan views. FIG. 10(b) to FIG. 18(b) respectively show cross-sectional views taken along 10B-10B' direction shown in FIG. 10(a) to FIG. 18(a). FIG. 10(c) to FIG. 18(c) respectively show cross-sectional views taken along 10C-10C' direction shown in FIG. 10(a) to FIG. 18(a). FIG. 10(d) to FIG. 18(d) respectively show cross-sectional views taken along 10D-10D' direction shown in FIG. 10 (a) to FIG. 18(a).

2.1

First, as shown in FIGS. 10(a)-(d), pairs of a polysilicon (Poly-Si) layer and an insulation film (insulator) formed on the polysilicon layer which function as word lines WL of four layers are formed on the semiconductor layer, not shown. Further, a stopper film A is applied above the insulation layer in a top layer.

2.2

Figure 11:
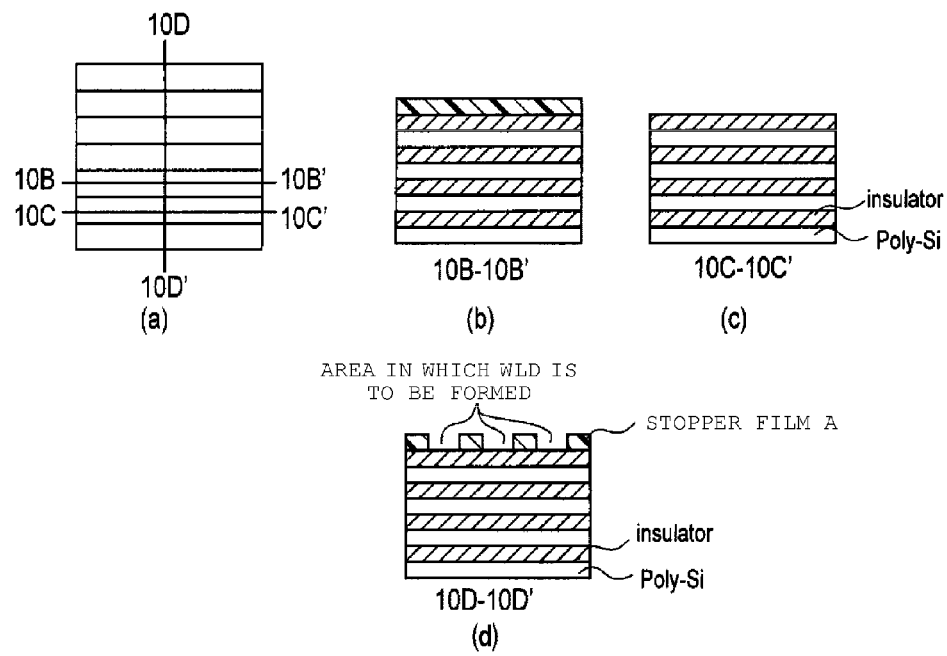
FIGS. 11($a$)-11($d$) illustrate a second manufacturing step of word lines according to the second embodiment.

Next, for example, some parts of the stopper film A in areas in which the word line WLD are to be formed is removed. Then, as shown in FIG. 11 (d), the remaining parts of the stopper film A exist alternately.

2.3

Figure 12:
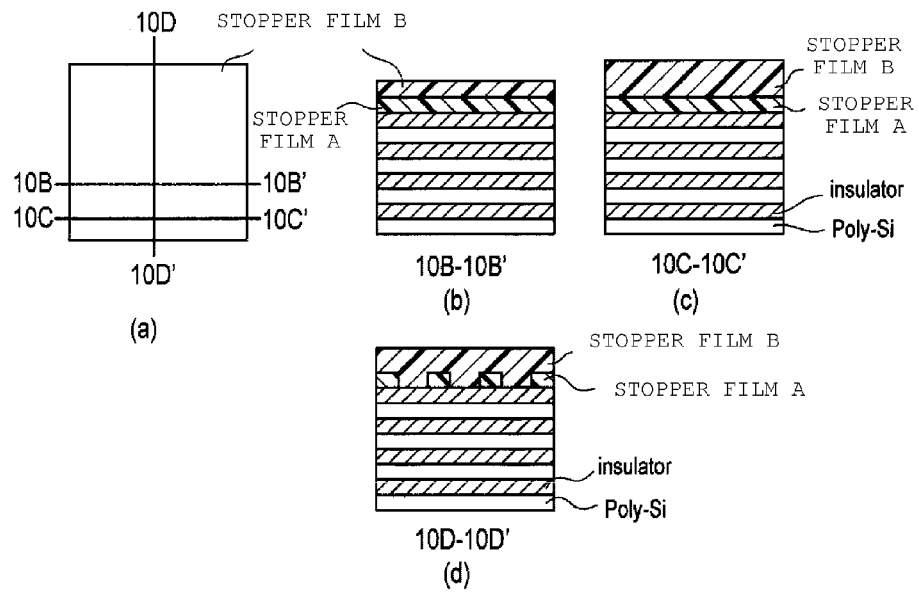
FIGS. 12($a$)-12($d$) illustrate a third manufacturing step of word lines according to the second embodiment.

Next, as shown in FIGS. 12 (a)-(d), a stopper film B is laminated above the stopper film A and the insulation film.

2.4

Figure 13:
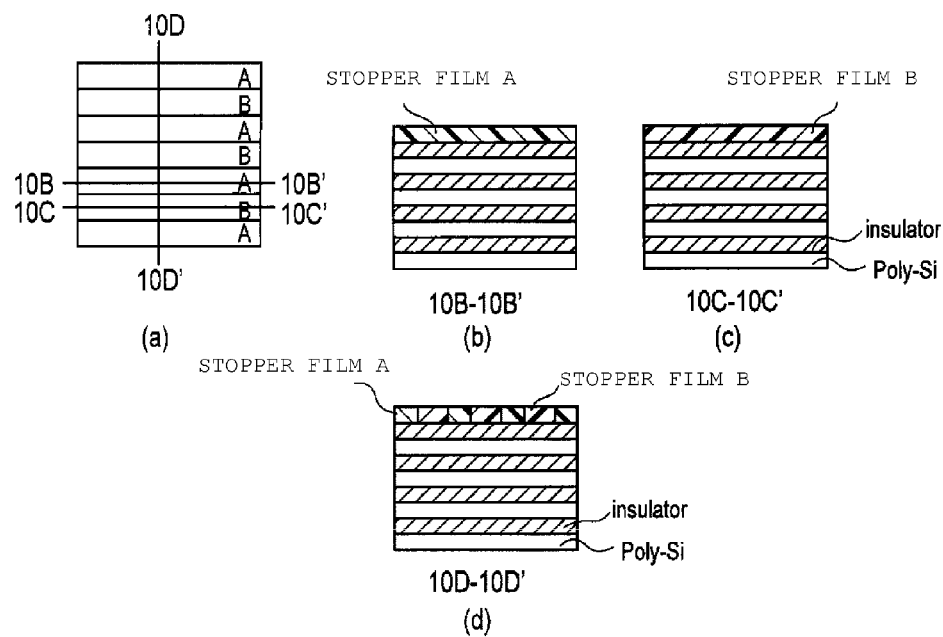
FIGS. 13($a$)-13($d$) illustrate a fourth manufacturing step of word lines according to the second embodiment.

Next, as shown in FIGS. 13 (a)-(d) in, for example, an upper face is flattened by a chemical mechanical polishing (CMP). This flattens the stopper film A and the stopper film B.

2.5

Figure 14:
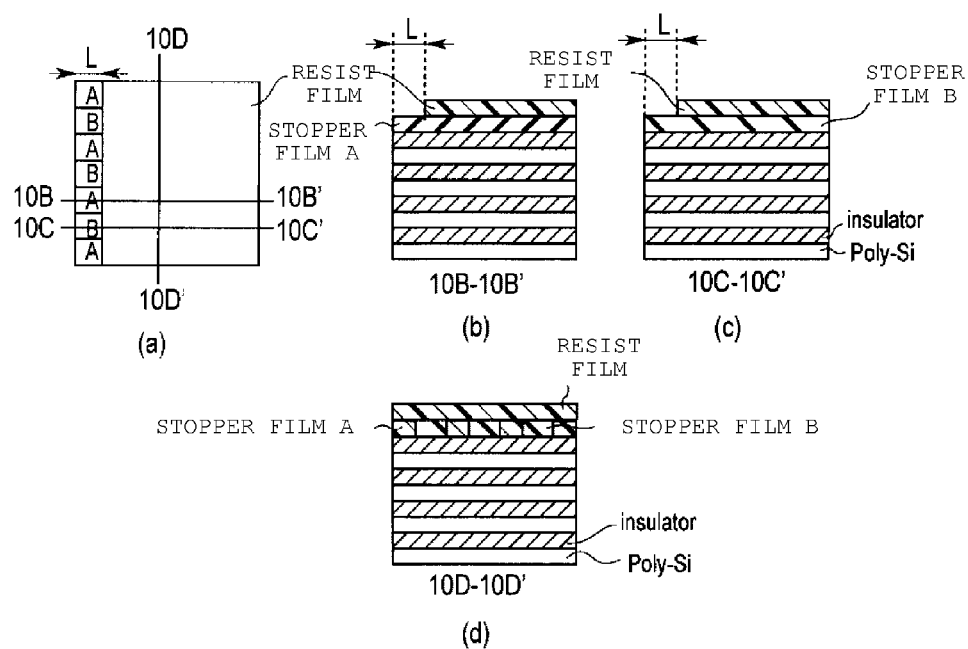
FIGS. 14($a$)-14($d$) illustrate a fifth manufacturing step of word lines according to the second embodiment.

Further, as shown in FIGS. 14 (a)-(d) in, after a resist film is laminated, a portion thereof is removed. A distance L of the removed portion corresponds to the length of an exposed portion of a staircase shape that will be subsequently formed.

2.6

2.6.1 Regarding Word Line WLS13

Figure 15:
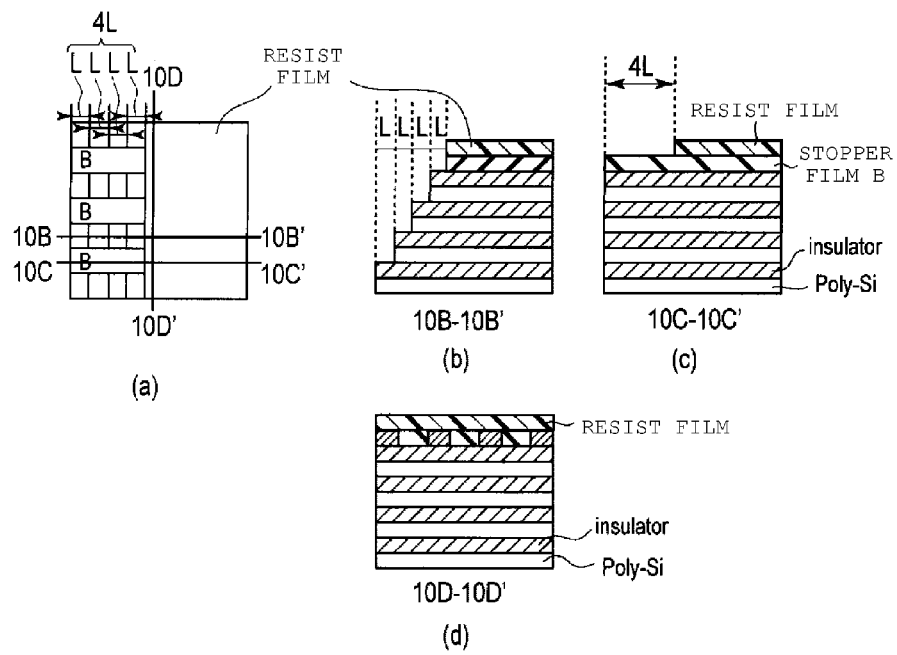
FIGS. 15($a$)-15($d$) illustrate a sixth manufacturing step of word lines according to the second embodiment.
Figure 16:
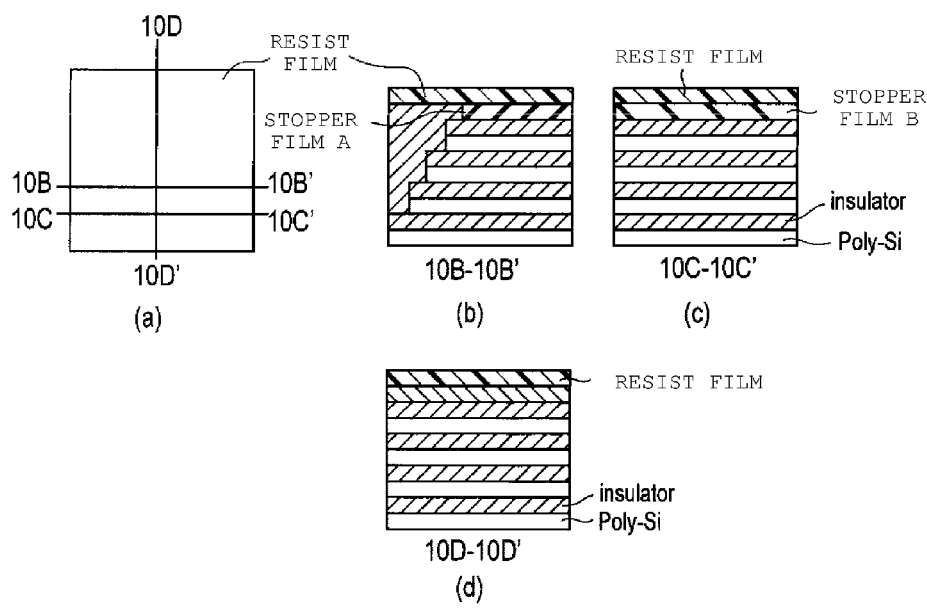
FIGS. 16($a$)-16($d$) illustrate a seventh manufacturing step of word lines according to the second embodiment.
Figure 17:
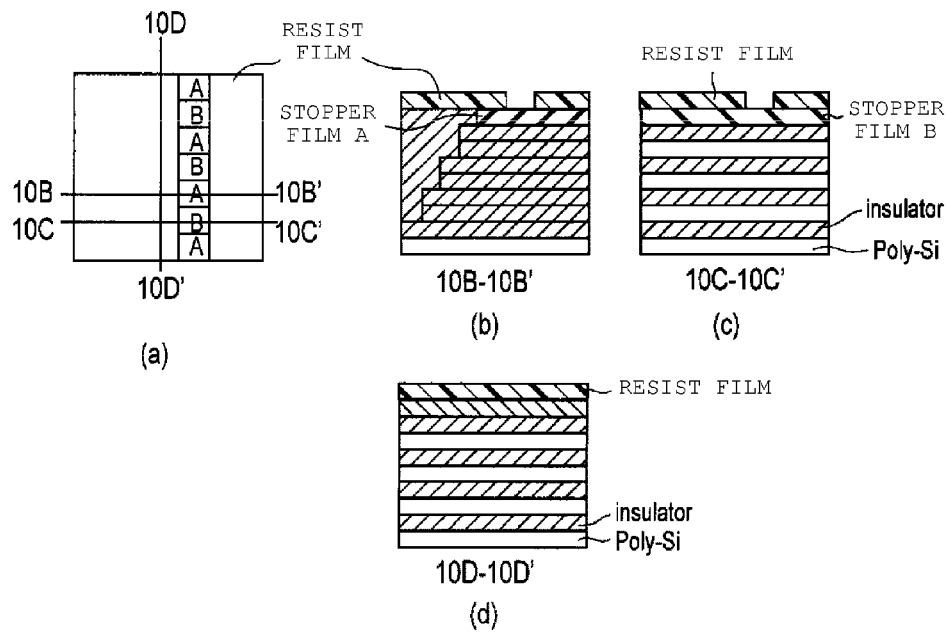
FIGS. 17($a$)-17($d$) illustrate an eighth manufacturing step of word lines according to the second embodiment.
Figure 18:
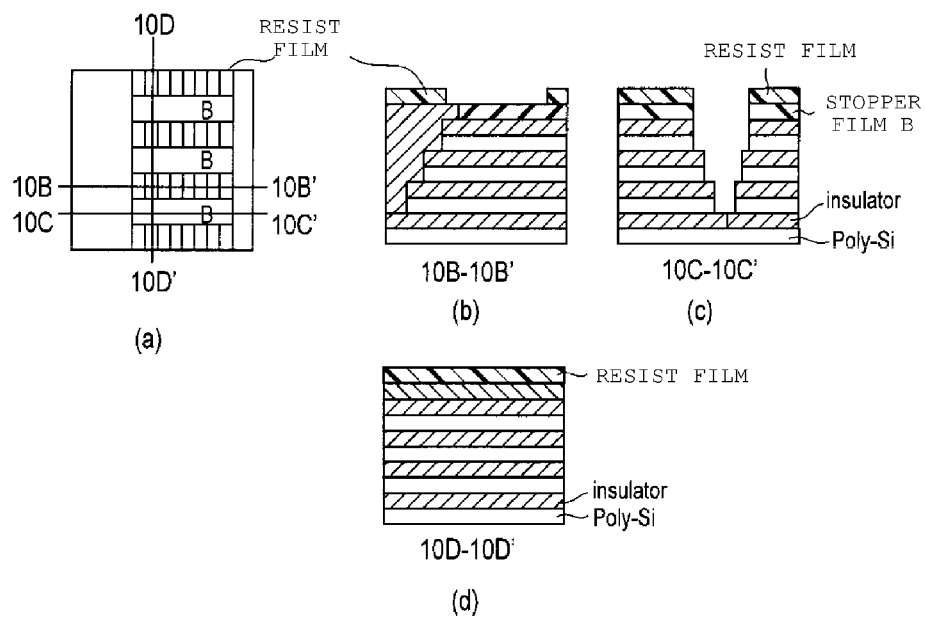
FIGS. 18($a$)-18($d$) illustrate a ninth manufacturing step of word lines according to the second embodiment.

Next, as shown in FIGS. 15 (a)-(d) in, under the condition that the stopper film B is not removed, the stopper film A, the polysilicon layers and the insulation films are removed by etching or the like (by L). Here, since the number n of the laminated layers is 4 (n=4), the word line WLS13 (the insulation film thereabove) that is in contact with a bottom layer is exposed by a first etching.

2.6.2 Regarding Word Line WLS12

Next, as shown in FIGS. 15 (a)-(d) in, a portion of the resist film is further removed. In the same manner as the above, a length L of the resist film to be removed corresponds to a length of the exposed portion of word lines WLS.

Next, after the resist film is removed, in order to remove a surface of the word line WLS12 (insulation film thereabove), the stopper film A, the polysilicon layer and the insulation film are removed by etching.

The removal of the resist film, the stopper film A, the polysilicon layer and the insulation film is repeated for WLS11 and WLS10 (FIG. 2), thereby in a formed area of a word line WLS, a stair case shape of 4 layers is obtained as shown in FIGS. 15(a)-(d). Thereafter, the resist film is once removed.

2.7

Next, the insulation film is laminated, and then the insulation film is flattened until the upper faces of the stopper film A and the stopper film B are exposed. Thereafter, the resist film is again applied above the stopper film A, the stopper film B and the insulation film. Accordingly, FIGS. 16 (a)-(d) are obtained.

2.8

Next, as shown in FIGS. 17(a)-(d) in, a portion of the resist film is removed, and thereby the stopper film A and the stopper film B are exposed.

2.9

Thereafter, as shown in FIGS. 18(a)-(d) in, in turn, the etching of the stopper film. B, the insulation film and the polysilicon layer and the removal of the resist are repeated in the same manner as 2.6 with respect to word lines WLD14 to WLD17 constituting the word lines WLD (refer to (c) in FIG. 18).

Thereafter, the insulation film and the resist film laminated on an area in which the word lines WLS are formed are removed, then necessary contact plugs, signal wirings and the like are formed, and thus the shape shown in FIG. 5 is formed.

Effect According to Second Embodiment

In a non-volatile semiconductor device according to the second embodiment, the effects of (3) and (4) can be achieved in addition to the effects of (1) and (2).

(1) and (2) It is possible to reduce a circuit area.

Figure 19:
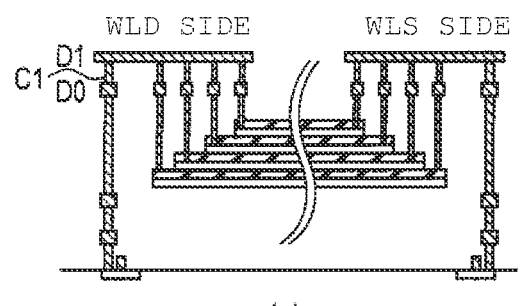
FIG. 19($a$) illustrates memory cell arrays according to a comparative example, and FIG. 19($b$) illustrates memory cell arrays according to the second embodiment.
Figure 19:
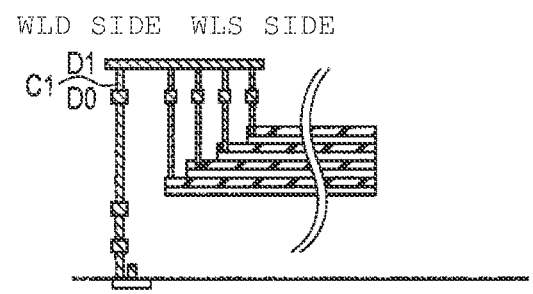
Figure 20:
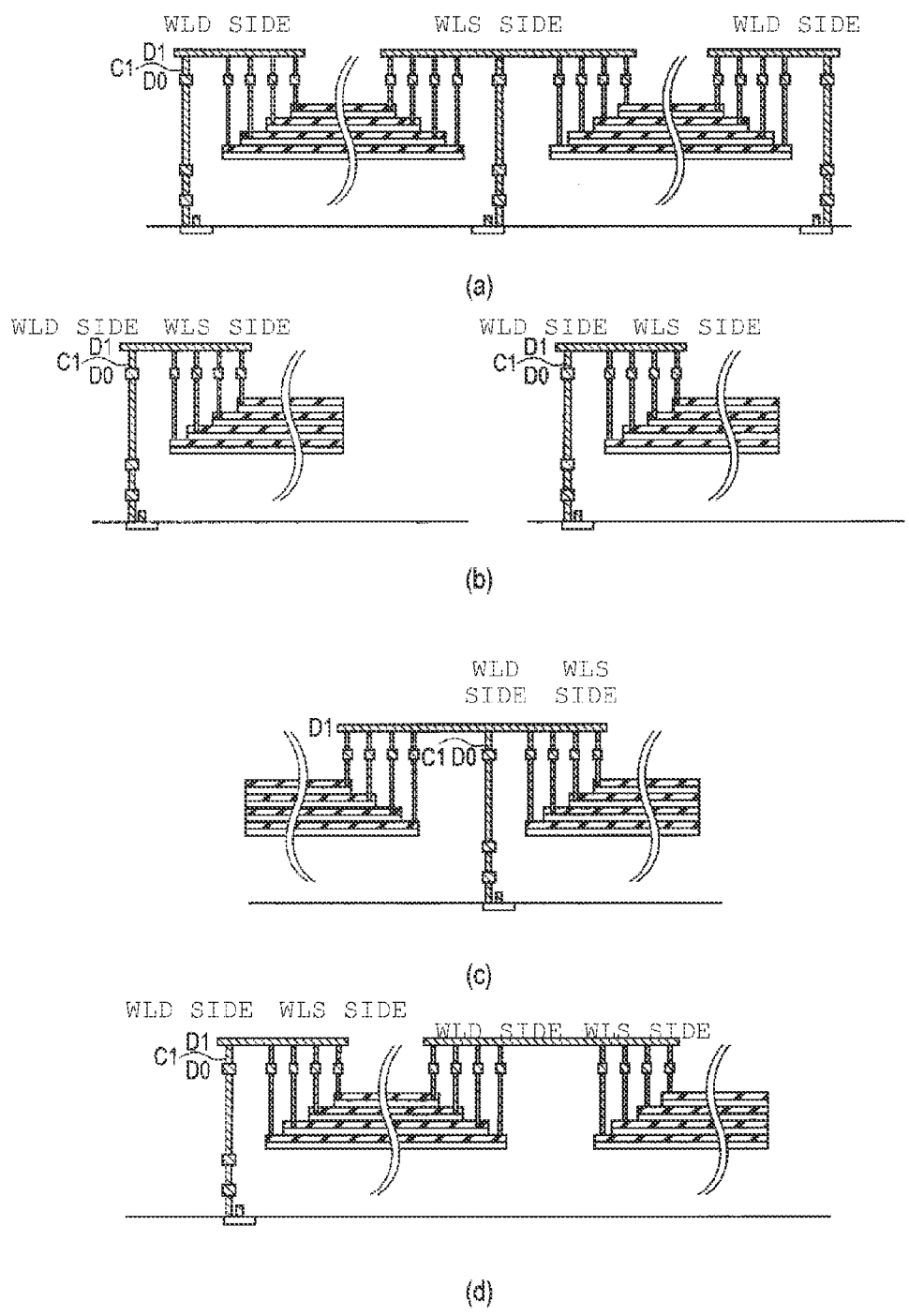
FIG. 20($a$) illustrates memory cell arrays according to a comparative example, and FIGS. 20($b$) to 20($d$) illustrate memory cell arrays according to the second embodiment.

FIG. 19(a) and FIG. 20(a) illustrate memory cell arrays according to a comparative example. In FIGS. 19 and 20, D1, D0, C1 correspond to the D1 layer, the D0 layer, and the contact plug C1 in FIG. 5, respectively. Further, WLD and WLS in FIGS. 19 and 20 correspond to the word line WLD and the word line WLS in FIG. 5. In this comparative example, the power supply circuits for the word lines WL are provided at both ends of the memory cell array 10. In this embodiment, the power supply circuit that supplies voltages to the word lines WL can be arranged in one place as shown FIG. 19(b), FIG. 20(b), FIG. 20(c) and FIG. 20(d).

(3) It is possible to reduce a block size.

The block size depends on a width of a plurality of signal wirings S2 in the second direction. In the non-volatile semiconductor device according to the second embodiment, it is possible that the width of a plurality of signal wirings S2 in the second embodiment can be shorter than the width of a plurality of signal wirings S2 in the first embodiment. Therefore, compared to the first embodiment, it is possible to reduce the size of one block BLK in the second embodiment.

The above effect of (3) can be illustrated using FIG. 5 in the first embodiment and FIG. 9 in the second embodiment.

In the case of the first embodiment, a length in the second direction requires a width in which the signal wirings S2 are arranged in parallel as shown in FIG. 5. That is, 8 signal wirings S2 are arranged at predetermined intervals (any distance that is not affected by the wire capacity), the width of 8 signal wirings S2 in FIG. 5 being defined as "$l_1$".

In the case of the second embodiment, as shown in FIG. 9, the signal wirings S2_S and the signal wirings S2_D can be arranged to be overlapped with each other in the second direction. Therefore it is possible to set the width of the area occupied by a plurality of signal wirings S2 that are provided as shown in FIG. 9 in the second direction to "$l_2$", the length "$l_2$" being shorter than the length "$l_1$". When the signal wirings S2 are arranged, it is possible to reduce the width in the second direction, and thereby further reducing the width of one block BLK compared to the first embodiment. As a result, in the second embodiment, it is possible to further reduce the size of the block relative to the first embodiment.

In other words, for example, even if n=8, and eight signal wirings S2_S and eight signal wirings S2_D are required (in total 16) in the second direction, the signal wirings S2_S and the signal wirings S2_D can be arranged to be overlapped with each other in the second direction, and thus it is possible to reduce the size of one block BLK.

To be more specific, in the second embodiment, if the signal wirings S2_S and the signal wirings S2_D are arranged to be overlapped with each other, it is possible to reduce the size of the block BLK in half compared to the first embodiment.

(4) It is possible to reduce the influence of the wiring capacitance.

In the non-volatile semiconductor device according to the exemplary embodiment, it is possible to set the distance in the second direction to $(l_1/2 \leq) l_2 (< l_1)$, compared to the first embodiment.

That is because four signal wirings S2 (if n=4) may be arranged within $l_{D'}$, or $l_{S'}$ on the same layer (here, D1 layer). For this reason, it is possible to widen the distance between the adjacent signal wirings S2. More specifically, it is possible to extend the width w3 to the width w4.

To be more specific, if the signal wirings S2_S and the signal wirings S2_D are arranged to be overlapped with each other or the signal wirings S2_S (or the signal wirings S2_D) are equally arranged, a relationship of $3 \times w3 \approx w4$ is established between w3 and w4.

Accordingly, it is possible to reduce a wiring capacitance and improve a stability of a circuit operation.

In addition, in the second embodiment, the word lines WLS and the word lines WLD are alternately formed in order to make the distances respectively extended by the word lines WLD and the word lines WLS different from each other, whereas the word lines WLS and the word lines WLD may be formed simultaneously in the first embodiment.

Third Embodiment

Next, the semiconductor memory device according to a third embodiment will be described using FIG. 21. The semiconductor memory device according to the third embodiment does not share a word line WLS and a word line WLD in D0 layer, but share them in the signal wirings (hereinafter, signal wirings S3) that passes through the SG layer. Therefore, the third embodiment is different from the first and second embodiments in that the signal wirings S2_S and the signal wirings S2_D that function as extracted wires are formed not only in D1 layer, but also are formed in an unoccupied area, that is, D0 layer.

1. Regarding Extraction of Signal Wirings

Figure 21:
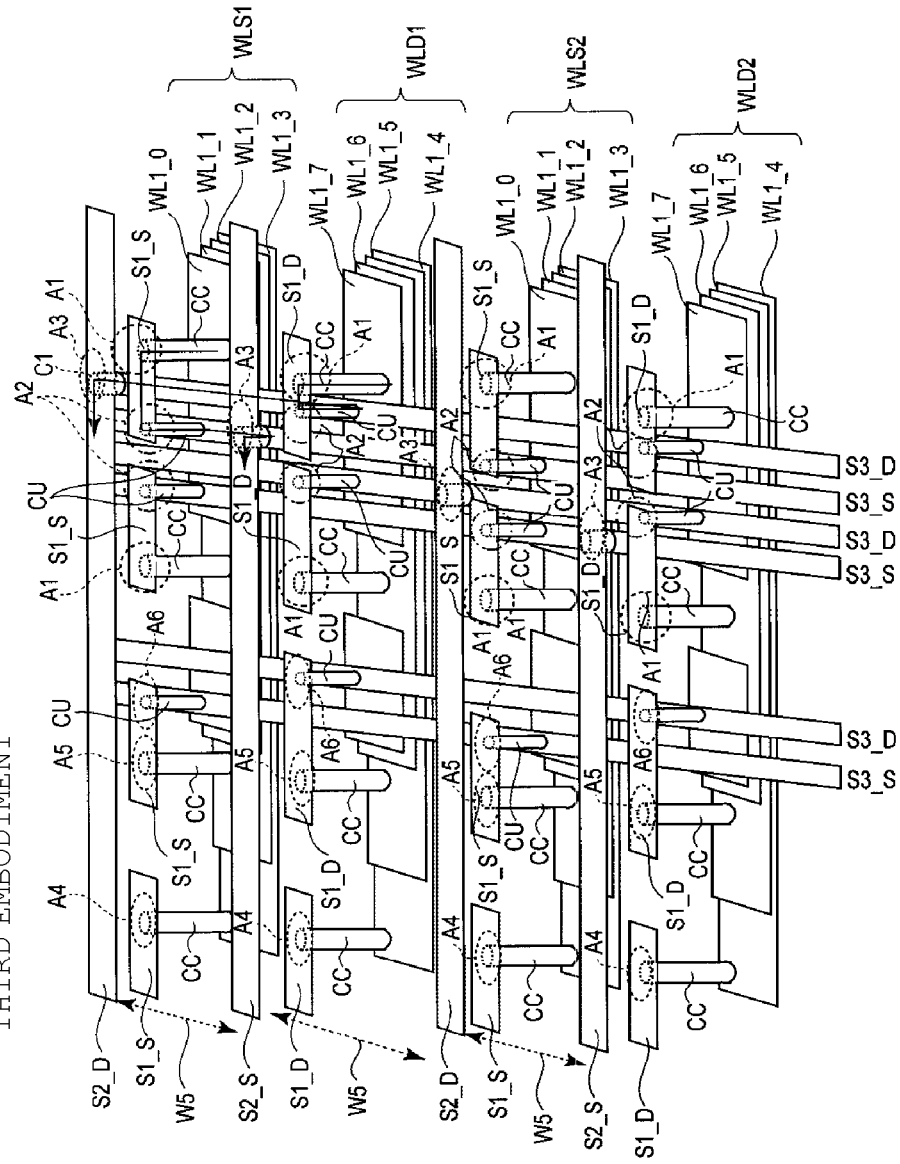
FIG. 21 is a perspective view illustrating signal wirings according to a third embodiment when n is 4.

FIG. 21 illustrates a configuration in which the signal wirings are extracted. Hereinafter, a configuration of the signal wirings S2 will be separately described in the D0 layer and the D1 layer.

1.1 Regarding Extraction of the Signal Wirings Using D0 Layer 1.1.1 Word lines WLS1_6 and WLS1_7, and WLD1_0 and WLD1_1

As shown in FIG. 21, contact plugs CC are arranged on the word lines WLS16, WLS17, WLD10 and WLD11. The upper ends of the contact plugs CC are connected to the signal wirings S1_S and the signal wirings S1_D (in FIG. 21, A1) that are formed along the first direction.

Further, the signal wirings S1_S and the signal wirings S1_D are connected to the signal wirings S3_S1 and the signal wirings S3_D2 (in FIG. 21, A2) that are formed in the SG layer, through the contact plugs CU.

Then, the contact plugs C1 are provided on each of the signal wirings S3_S and the signal wirings S3_D (in FIG. 21, A3). Next, signals are extracted by the signal wirings S2_S, and the signal wirings S2_D (D0 layer) that are connected to the upper end of the contact plugs C1.

1.1.2 Regarding Word Lines WLS1_3 and WLD1_4

As shown in FIG. 21, the contact plugs CC are formed on the word lines WLS1_3 and WLD1_4 (in FIG. 21, A4). Next, the upper ends of the contact plugs CC are connected to the signal wirings S2_S and the signal wirings S2_D that are formed along the first direction. That is, the extraction of the signals is performed with respect to the word lines WLS1_3 and WLD1_4 using D0 layer.

1.2 Regarding Extraction of the Signal Wirings Using D1 Layer

Next, the extraction of the signal wirings S2 using the D1 layer will be described. As shown in FIG. 21, the contact plugs CC are formed on the word lines WLS1_2 and WLD1_5 (in FIG. 21, A5).

The upper faces of the contact plugs CC are connected to the signal wirings S1_S and the signal wirings S1_D that are formed along the first direction. Further, the signal wirings S1_S and the signal wirings S1_D are respectively connected to the signal wirings S3_S and the signal wirings S3_D through the contact plugs CU (in FIG. 21, A6).

The signal wirings S3_S and the signal wirings S3_D are connected to the signal wirings S2_S and the signal wirings S2_D located in the D1 layer, not shown, through the contact plugs C1.

As described above, extracting of signals are performed using D1 layer with respect to the word lines WLS_2 and WLD_5.

Effect According to Third Embodiment

In the non-volatile semiconductor device according to the exemplary embodiment, the effects of (5) and (6) can be achieved in addition to the effects according to (1) and (2).

(5) It is possible to reduce a block size.

That is, since the method of extracting the signal wirings S2 uses not only D1 layer but also D0 layer, it is possible to reduce the widths of the areas occupied by the signal wirings S2 in the second direction. In other words, if n=4, eight signal wirings S2 are needed, but the eight signal wirings S2 are divided and extracted in two layers, thereby only four signal wirings S2 are arranged in one layer.

Therefore, it is possible to reduce the distance occupied by the signal wirings S2 in the second direction and also to reduce a size of one block. The same configuration is applied to a case where n=8 or more.

(6) It is possible to reduce the influence of the wiring capacitance.

As described above, since the method of extracting the signal wirings S2 uses not only D1 layer but also D0 layer, only four signal wirings S2 are arranged in one layer. Therefore, it is possible to further extend the width w3 between the adjacent signal wirings S2 to the width w5 compared to the case of FIG. 7. Here, a relationship of w3>w4>w5 or w3>w5>w4 may be established among w3, w4 and w5.

Fourth Embodiment

Next a semiconductor memory device according to a fourth embodiment will be described using FIG. 22. In the fourth embodiment, the signal wirings S1 are arranged in a zigzag pattern along the first direction, then the signal wirings S2 are arranged in a "<" shape using an unoccupied space, and thus the extraction of the signals are performed even in the D0 layer in addition to the D1 layer. In addition, the fourth embodiment is the same as the third embodiment in that the signal wirings S3 which commonly connect the word lines WL are provided in an SG layer.

1. Regarding Extraction of Signal Wirings

Figure 22:
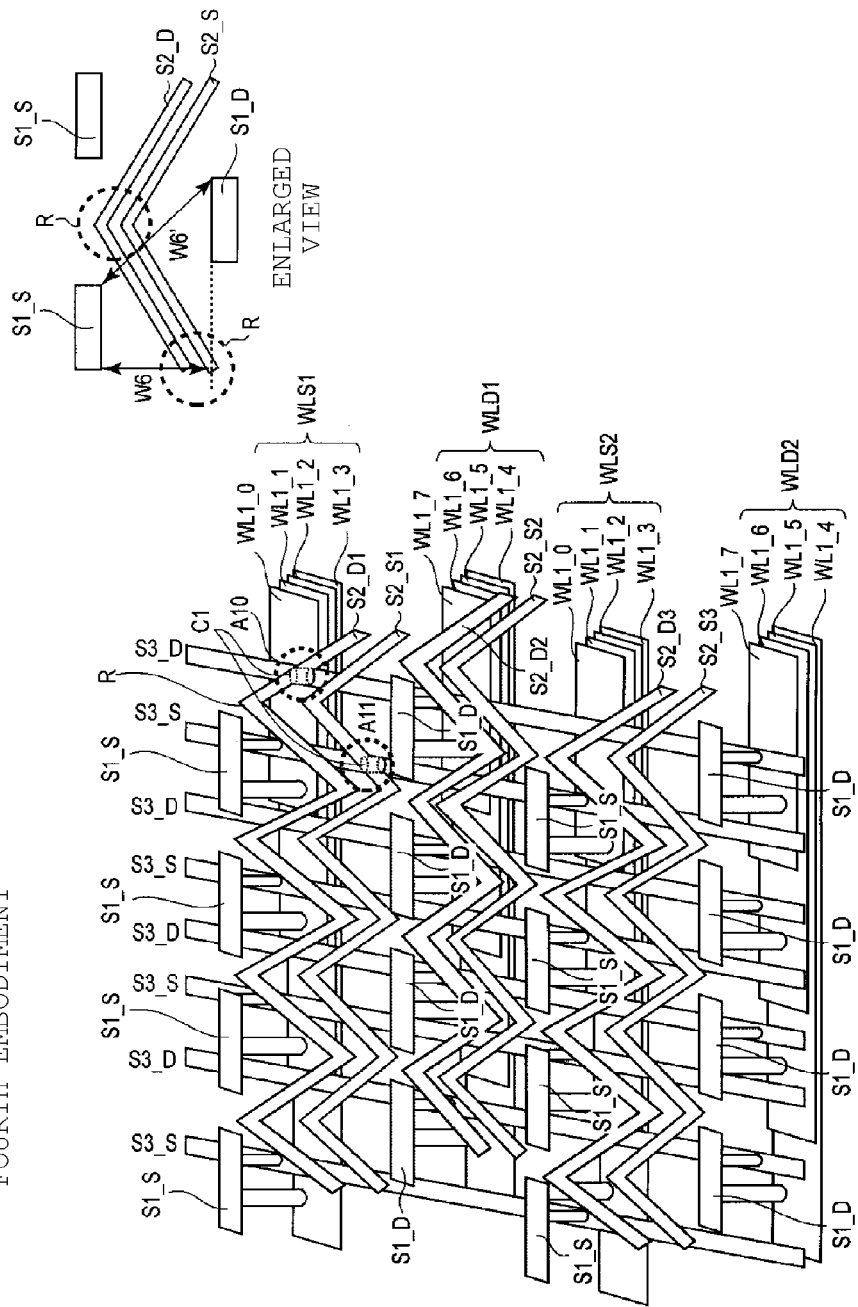
FIG. 22 is a perspective view illustrating signal wirings according to a fourth embodiment when n is 4.

FIG. 22 illustrates a configuration in which the signal wirings are extracted. In addition, the same configuration as the third embodiment will not described. In addition, the signal wirings S2_S1 and S2_S2 and the signal wirings S2_D1 and S2_D2 that are shown in FIG. 22 are simply referred to as the signal wirings S2_S and the signal wirings S2_D.

1.1 Regarding Signal Wirings S1

As shown in FIG. 22, the signal wirings S1_S and S1_D are respectively arranged above the word lines WLS1_0 to WLS1_3 and the word lines WLD1_4 to WLD1_7. Hereinafter, the word lines WLS and the word lines WLD will be separately described.

1.1.1 Regarding Signal Wirings S1_S Above Word Lines WLS

Each of the signal wirings S1_S above the word lines WLS is arranged in the vicinity of the leading ends of the word lines WLS in the first direction. Specifically, each of the signal wirings S1_S is arranged above the adjacent word lines WLD and between two adjacent signal wirings S1_D along the first direction.

In order to realize such an arrangement, both the contact plugs CC and the contact plugs CU need to be arranged in the vicinity of the leading ends of the word lines WLS.

1.1.2 Regarding Signal Wirings S1_D Above Word Lines WLD

Each of the signal wirings S1_D above the word lines WLD is arranged from the middle part of the word lines WLD to the vicinity of the rear part thereof. Specifically, each of the signal wirings S1_D is arranged above the adjacent word line WLS and between two adjacent signal wirings S1_S along the first direction.

Through such an arrangement, the signal wirings S1_S and S1_D are arranged in a zigzag pattern in the first direction.

A description will be made using an enlarged view (plan view). As shown in the enlarged view, when seen in the second direction, an interval between the adjacent signal wirings S1 is w6. However, when seen obliquely, an interval between the two adjacent signal wirings S1 becomes w6' (>w6). That is, the signal wirings S1_S and S1_D are arranged in a zigzag pattern in order to make a space through which two wirings including the signal wirings S2_S and S2_D pass.

1.2 Regarding Signal Wirings S2_D and Signal Wirings S2_S

Next, the signal wirings S2_D and the signal wirings S2_S are respectively arranged such that a cross cut portion (in FIG. 22, R) of the signal wirings S2 is arranged in an unoccupied space in the first direction.

Hereinafter, each configuration of the signal wirings S2_D and the signal wirings S2_S will be described.

1.1.1 Regarding Signal Wirings S2_D1

The signal wirings S2_D1 are electrically connected to the word lines WLD0 through the contact plugs C1 (area A10), the signal wirings S3_D, the contact plugs CU, the signal wirings S1_D, and the contact plugs CC.

1.1.2 Regarding Signal Wirings S2_S1

The signal wirings S2_S1 are electrically connected to the word lines WLS0 through the contact plugs C1 (area A11), the signal wirings S3_S, the contact plugs CU, the signal wirings S1_S, and the contact plugs CC.

1.1.3 Regarding Other Signal Wirings S2_D and S2_S

Other signal wirings S2_D2 to S2_D4, and the signal wirings S2_S2 to S2_S4 have the same configuration. That is, the signal wirings S2_D2 to S2_D4, and the signal wirings S2_S2 to S2_S4 are arranged in a shape of "<" so as to not to be in contact with the signal wirings S1. In addition, the signal wirings S2_D2 to S2_D4, and the signal wirings S2_S2 to S2_S4 are respectively connected to the corresponding word lines WLD1 to WLD3, and the corresponding word lines WLS4 to WLS6.

Effect According to the Fourth Embodiment

In the non-volatile semiconductor device according to the exemplary embodiment, the effect of (7) can be achieved in addition to the effects according to (1) and (2).

(7) It is possible to reduce a block size.

That is, in the non-volatile semiconductor device according to the exemplary embodiment, two signal wirings S2 may pass through between the word lines WLS and the word lines WLD that are adjacent to each other. If n=4 layers, in total six signal wirings S2 may pass in the exemplary embodiment, as compared to that only four signal wirings S2 may pass in the third embodiment.

That is, if n=4, eight signal wirings S2 are needed. Among these, six signal wirings S2 may be arranged in the D0 layer, and remaining two signal wirings S2 may be arranged in the D1 layer. Accordingly, it is possible to reduce the size of the block.

Fifth Embodiment

Next, a semiconductor memory device according to a fifth embodiment will be described using FIG. 23.

In the fifth embodiment, the signal wirings are formed in which the word lines WL are arranged in the SG layer, instead of the D0 layer like the third embodiment. In addition, even in this case, the signal wirings from which the word lines WL are extracted using the D1 layer are formed.

Specifically, in the third embodiment, the signal wirings S2 that are arranged in the direction of the word lines WL are arranged in the direction of the bit lines BL, and the signal wirings S3 that are arranged in the direction of the bit lines BL are arranged in the direction of the word lines WL. Hereinafter, a configuration thereof will be described.

1. Regarding Extraction of Signal Wirings

Figure 23:
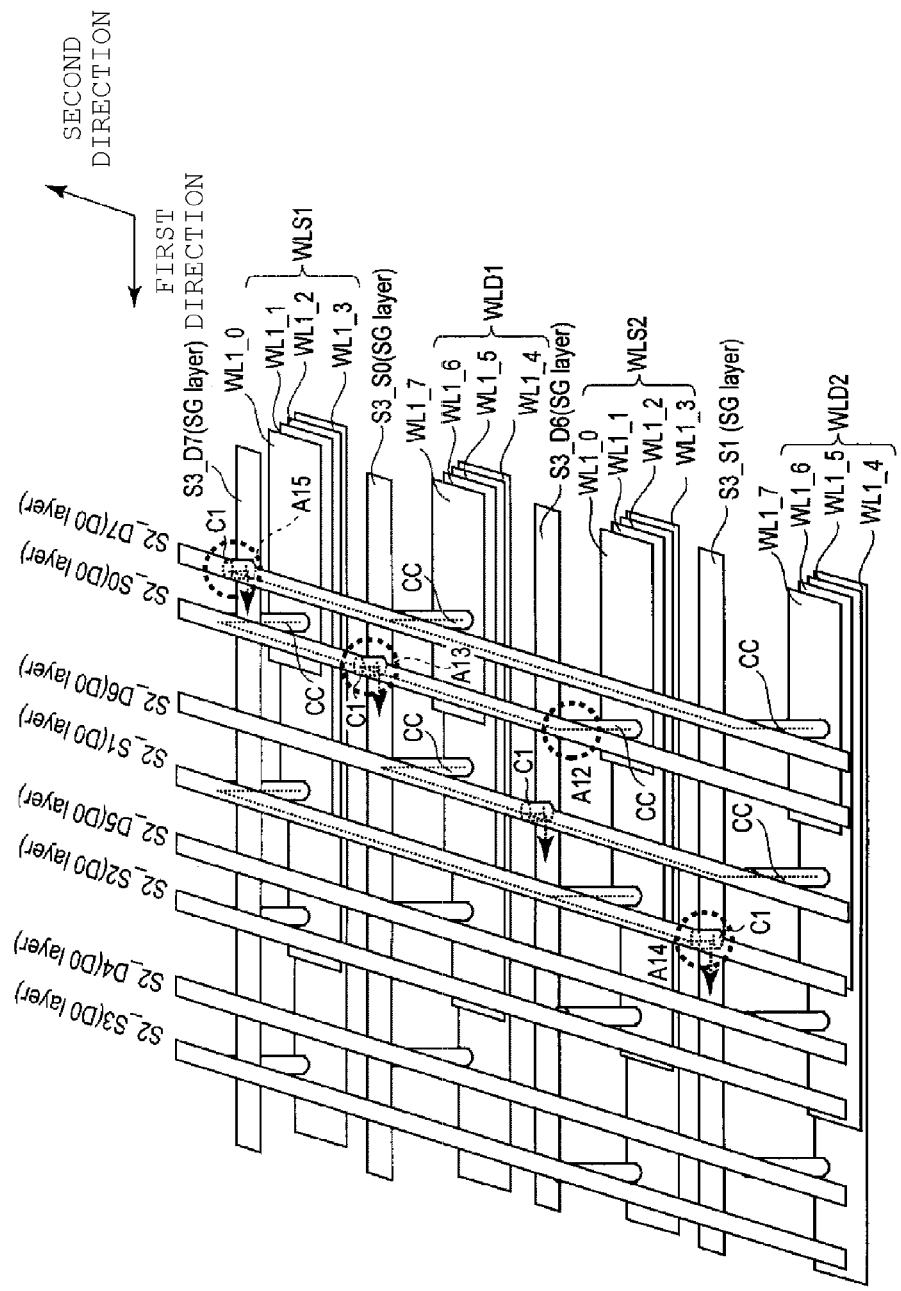
FIG. 23 is a perspective view illustrating signal wirings according to a fifth embodiment when n is 4.

As shown in FIG. 23, signal wirings S3_S0 and S3_S1, and signal wirings S3_S6 and S3_S7 are arranged in the SG layer in the direction of the word lines WL.

Further, signal wirings S2_D4 to S2_D7, and signal wirings S2_S0 to S2_S3 are arranged in the D0 layer in the direction of the bit lines BL. Hereinafter, the signal wirings S3_S0, and the signal wirings S3_D7 will be focused.

1.1 Regarding Signal Wirings S3_S0

The signal wirings S3_S0 are connected to the lower ends of the contact plugs C1 (area A12) in an upper face. The contact plugs C1 are connected to the signal wirings S2_S0 in the upper face.

The signal wirings S2_S0 are connected to the word lines WLS0 through the contact plugs CC (areas A13 and A14).

1.2 Regarding Signal Wirings S3_D7

The signal wirings S3_D7 are connected to the lower end of the contact plugs C1 (area A15) in the upper face. The contact plugs C1 are connected to the signal wirings S2_D7 in the upper face.

The signal wirings S2_D7 are connected to the word lines WLD7 through the contact plugs CC (areas A16 and A17).

1.3 Regarding Other Signal Wirings

As shown in FIG. 23, the signal wirings S3_S1 and the signal wirings S3_D6 have the same configuration.

Further, the word lines WLS2 and WLS3, and the word lines WLD4 and WLD5 are extracted using the signal wirings formed in the D1 layer which is not shown.

Effect According to the Fifth Embodiment

Even in the non-volatile semiconductor device according to the fifth embodiment, the same effect as that of the third embodiment can be achieved. That is, it is possible to reduce the size of the block even in the exemplary embodiment.

By only changing the extracting layer from D0 layer to the SG layer, there is no change in the number itself of the extractions of the signal wirings in each block as compared to the third embodiment.

In this manner, it is possible to extract the signal wirings from the D0 layer and the SG layer only by changing the connection relationship between the signal wirings and the contact plugs.

Sixth Embodiment

Next, a semiconductor memory device according to a sixth embodiment will be described using FIG. 24 and (a) to (c) in FIG. 25. The semiconductor memory device according to the sixth embodiment is formed by applying the first embodiment into a semiconductor layer SC. That is, the semiconductor memory device according to the sixth embodiment has a configuration in which the semiconductor layers SC are arranged on one side, and then the semiconductor layers SC are shared by the signal wirings and the contact plugs CP.

Figure 24:
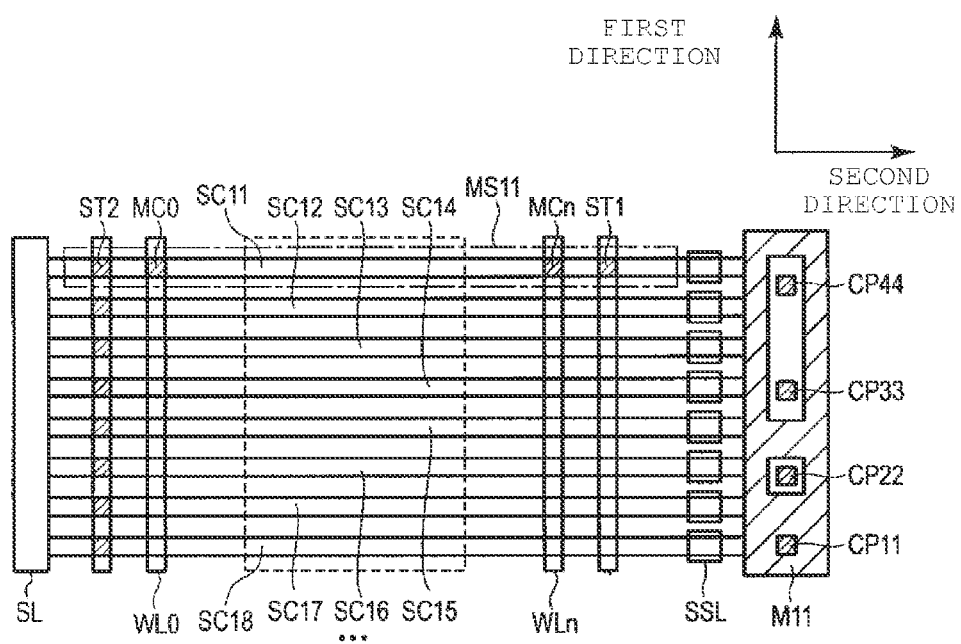
FIG. 24 is a plan view of a semiconductor memory device according to a sixth embodiment.

First, a prerequisite configuration will be shown in FIG. 24, before showing the configuration in which the semiconductor layers SC are shared by the signal wirings S and the contact plugs CP. FIG. 24 is a conceptual view in which the semiconductor layers SC are shared in a metal layer M which will be described later.

1. Configuration Example

As shown in FIG. 24, a metal layer M11, SSL, signal wirings SGD, word lines WL0, . . . , WLn, signal wirings SGS, and source lines SL are arranged in the first direction.

Next, semiconductor layers SC11 to SC18 which end in each of the source lines SL and the metal layer M11 and pass through the SSL, the signal wirings SGD, the word lines WL0 . . . , WLn, and the signal wirings SGS are formed in the second direction (the semiconductor layers SC11 to SC18 are simply referred to as semiconductor layers SC).

That is, selection transistors ST2 are provided at intersections of the semiconductor layers SC and the signal wirings SGS, and selection transistors ST1 are provided at intersections of the semiconductor layers SC and the signal wirings SGD.

Further, memory cells MC are respectively provided at intersections of the semiconductor layers SC and word lines WL0, . . . , and WLn.

In other words, for example, if the semiconductor layer SC11 is focused, the selection transistors ST1 and ST2, a plurality of memory cells MC0 to MCn of which both ends are interposed between the selection transistors ST1 and ST2, and the memory string MS11 including the source lines SL are provided in the semiconductor layer SC11.

Further, as shown in FIG. 24, the semiconductor layers SC12 to SC18 include the same elements and connections as the elements and connections included in the semiconductor layer SC11. That is, the memory strings MS12 to MS18 are formed in areas of the semiconductor layers SC12 to SC18.

In addition, the memory strings MS11 to MS18 are simply referred to as memory strings MS.

The semiconductor layers SC11 to SC18 indicate the semiconductor layers SC1 to SC8 of a first layer, and in the same manner, the memory strings MS11 to MS18 indicate the memory strings MS1 to MS8 of a first layer.

Hereinafter, the connection between the metal layer M11 and each of the memory string MS will be described.

As shown in FIG. 24, the memory strings MS11 to MS18 are commonly connected to the metal layer M11. The contact plugs CP11 are formed on an upper face of the metal layer M11. The contact plugs CP11 are connected to the bit lines BL1, not shown. That is, the bit lines BL1 are formed in the memory string MS11 to MS18.

The plurality of the memory strings MS11 to MS18 is called a sub block BLK1.

Since FIG. 24 is a plan view, only the semiconductor layers SC11 to SC18 that are located in a top layer are illustrated, but actually, for example, four layers having the same configuration are arranged in the paper depth direction.

For this reason, for example, the semiconductor layers SC21 to SC28 located from the top layer to the second layer are commonly connected to a metal layer M22, and then connected to bit lines BL2 through the contact plugs CP22, not shown. That is, the memory strings MS21 to MS28 constitute a sub block BLK2. Hereinafter, up to a fourth layer, the same configuration as the above is applied, and plurality of the sub blocks BLK1 to BLK4 constitute a block BLK.

2. Configuration Example

Next, FIGS. 25(a)-(c) illustrate a configuration in which the signal wirings S and the contact plug CP share the semiconductor layer SC without the metal layer M being used.

Figure 25:
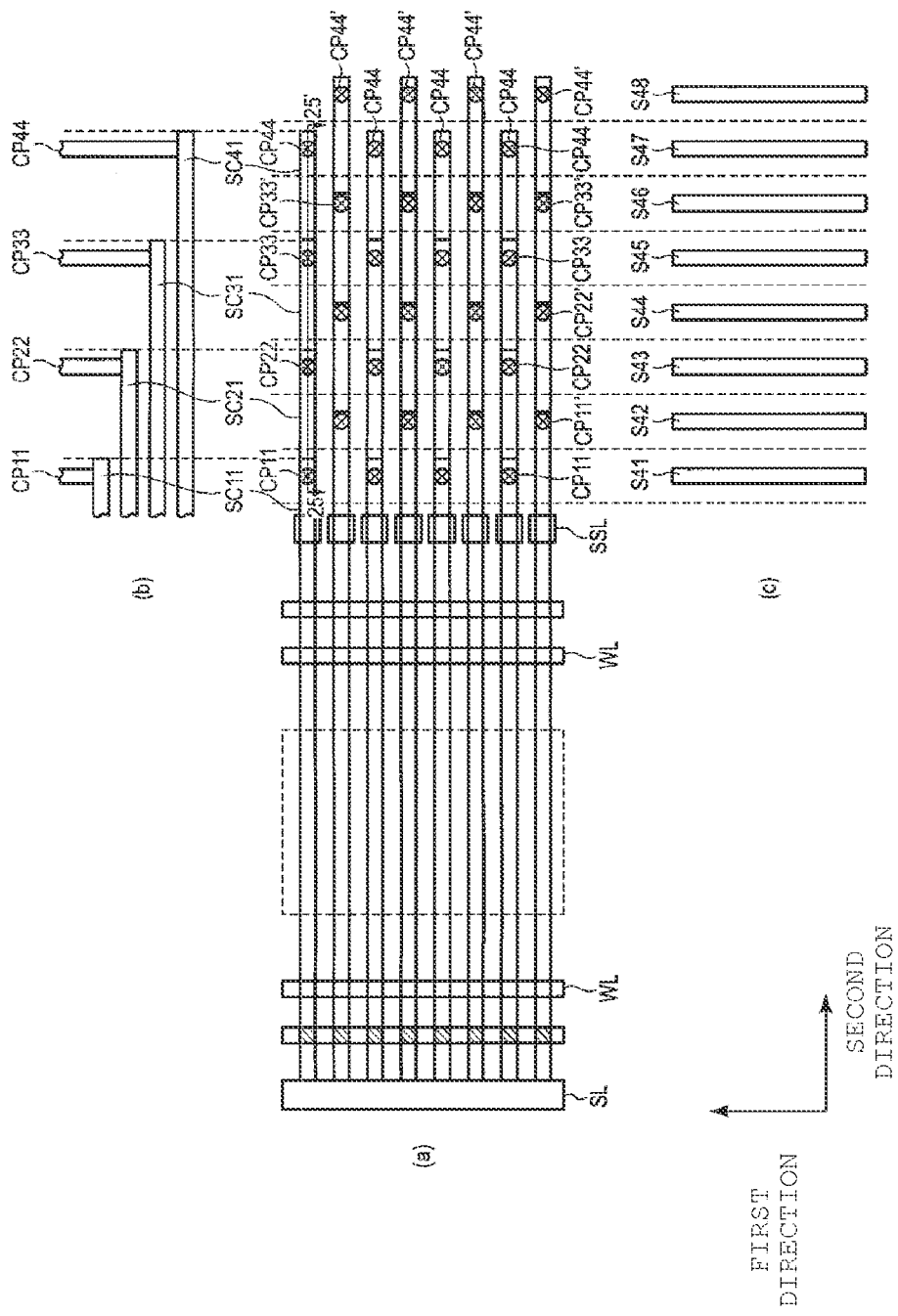
FIG. 25 is a cross-sectional view of the semiconductor memory device according to the sixth embodiment.

FIG. 25(a) is a plan view of the semiconductor memory device. FIG. 25(b) is a cross-sectional view in which for example, the semiconductor layers SC11 to SC41 in FIG. 25(a) are taken along 25-25'. FIG. 25 (c) illustrates signal wirings S41 to S48 that are formed on one layer of the semiconductor layers SC. The signal wirings S41 to S48 are arranged in the first direction.

Here, the signal wirings S41 to S48 are shifted from the plan view in FIG. 25(a), but actually, the signal wirings S41 to S48 are arranged above in FIG. 25(a). In addition, the same configuration as the configuration of FIG. 24 will not be described.

As shown in FIG. 25(a), the semiconductor layer SC of each layer is extended in the second direction, and the contact plugs CP are arranged in a zigzag pattern on the semiconductor layer SC, between the adjacent semiconductor layers SC. Since the contact plugs CP are arranged in a zigzag pattern in this manner, long and short semiconductor layers SC are alternately arranged.

Next, the cross-sectional view of the plan view will be described using FIG. 25(b). As shown, the semiconductor layers SC11 to SC41 are formed in a staircase shape. The contact plugs CP11 are formed on the semiconductor layer SC11. In the same manner, the contact plugs CP22 are formed on the semiconductor layer SC21, the contact plugs CP33 are formed on the semiconductor layer SC31, and the contact plugs CP44 are formed on the semiconductor layer SC41.

In addition, the semiconductor layers SC13 to SC43, the semiconductor layers SC15 to SC45, and the semiconductor layers SC17 to SC47 include the same connections and elements as the connections and elements of the semiconductor layers SC11 to SC41. Further, the positions at which the contact plugs CP are arranged in the second direction are the same.

Further, the contact plugs CP are shifted in the second direction and arranged as shown in FIG. 25(a), on the semiconductor layers SC12 to SC42, the semiconductor layers SC14 to SC44, the semiconductor layers SC16 to SC46, and the semiconductor layers SC18 to SC48.

In the configuration of FIG. 25(a), for example, the signal wirings S41 shown in FIG. 25(c) are commonly connected to a plurality of contact plugs CP11. In this manner, the signal wirings S41 are commonly connected using the contact plugs CP and the signal wirings S without using the metal layer M. For example, the same configuration is applied to the signal wirings S42. That is, the signal wirings S42 is commonly connected to a plurality of contact plugs CP11'. Similarly, the signal wirings S44, S46, and S48 are commonly connected to contact plugs CP22', CP33', and CP44', respectively.

Further, the signal wirings S41 and SC42 are commonly connected by the contact plugs CP and the signal wirings S, not shown, and then connected to, for example, the bit lines BL1.

Due to this configuration, the bit lines BL1 are connected to the memory strings MS11 to MS18 including the semiconductor layers SC11 to SC18.

In addition, the same configuration is applied to other signal wirings S43 to SC48. That is, the signal wirings S43 and SC44 are connected to the bit lines BL2, the signal wirings S45 and SC46 are connected to the bit lines BL3, and the signal wirings S47 and SC48 are connected to the bit lines BL4.

Effect According to the Sixth Embodiment

In a semiconductor memory device according to the sixth embodiment, it is possible to perform a common connection using the signal wirings S and the contact plug CP not only in the word lines WLD and WLS direction but also in the semiconductor layer SC (bit line BL) direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
a plurality of memory strings including first through third memory strings; and
a first word line group shared by the first and second memory strings and a second word line group shared by the second and third memory strings, the first and second word line groups extending in a first direction and disposed adjacent to each other in a second direction that is perpendicular to the first direction,
wherein the first word line group includes a plurality of first word lines that are laminated with each upper first word line extending in the first direction less than the first word line directly below, and the second word line group includes a plurality of second word lines that that are laminated with each upper second word line extending in the first directionless than the second word line directly below.

2. The non-volatile semiconductor memory device according to claim 1, further comprising:
a third word line group shared by third and fourth memory strings of the plurality of memory strings and a fourth word line group shared by the fourth and fifth memory strings of the plurality of memory strings, the third and fourth word line groups extending in the first direction and disposed adjacent to each other and adjacent to the first and second word line groups in the second direction,
wherein the third word line group includes a plurality of third word lines that are laminated with each upper third word line extending in the third direction less than the third word line directly below, and the fourth word line group includes a plurality of fourth word lines that that are laminated with each upper fourth word line extending in the third direction less than the fourth word line directly below.

3. The non-volatile semiconductor memory device according to claim 2, further comprising:
a first signal line group which is connected to the first and third word line groups through first contact plugs and extends in the second direction; and
a second signal line group which is connected to the second and fourth word line groups through second contact plugs and extends in the second direction.

4. The non-volatile semiconductor memory device according to claim 3, wherein the first signal line group and the second signal line group are arranged on a same layer that is above the word line groups.

5. The non-volatile semiconductor memory device according to claim 4, further comprising:
a third signal line group which is connected to the first signal line group through third contact plugs and extends in the first direction; and
a fourth signal line group which is connected to the second signal line group through fourth contact plugs and extends in the first direction.

6. The non-volatile semiconductor memory device according to claim 5, wherein the third signal line group and the fourth signal line group are arranged on a same layer that is above the layer of the first and second signal line groups.

7. The non-volatile semiconductor memory device according to claim 3, wherein the signal lines of the first and second signal line groups are interleaved.

8. The non-volatile semiconductor memory device according to claim 3, wherein the signal lines of the first and second signal line groups are not interleaved.

9. The non-volatile semiconductor memory device according to claim 3, wherein the first, second, third, and fourth contact plugs are in electrical contact with the exposed portions of the first, second, third, and fourth word lines, respectively.

10. The non-volatile semiconductor memory device according to claim 9, wherein each of the signal lines from the first signal group commonly connects one of the first word lines and the one of the third word lines, and each of the signal lines from the second signal group commonly connects one of the second word lines and the one of the fourth word lines.

11. A non-volatile semiconductor memory device comprising:
- a plurality of memory cell transistors;
- first word line groups and second word line groups connected to gates of the memory cell transistors, each word line group including a plurality of word lines that are laminated above a semiconductor layer and extending in a first direction perpendicular to a laminated direction, the first and second word line groups being arranged in an interleaved manner and spaced apart from one another along a second direction that is perpendicular to the first direction,
- a group of first signal wirings extending in the second direction, each connected in common to one word line from each of the first word line groups; and
- a group of second signal wirings extending in the second direction, each connected in common to one word line from each of the second word line groups.

12. The non-volatile semiconductor memory device according to claim 11, further comprising:
- a group of third signal wirings extending in the first direction, each connected to one of the first signal wirings; and
- a group of fourth signal wirings extending in the first direction, each connected to one of the second signal wirings.

13. The non-volatile semiconductor memory device according to claim 12, further comprising:
- first contact plugs that electrically connect the first signal wirings to the word lines in the first word line groups and the second signal wirings to the word lines in the second word line groups; and
- second contact plugs that electrically connect the first and second signal wirings to the third and fourth signal wirings.

14. The non-volatile semiconductor memory device according to claim 13, wherein all of the first contact plugs are at the same layer and all of the second contact plugs are at the same layer.

15. The non-volatile semiconductor memory device according to claim 14, wherein the first contact plugs are below the second contact plugs.

16. The non-volatile semiconductor memory device according to claim 11, wherein the first signal wirings and the second signal wirings are arranged along the first direction in an interleaved manner.

17. The non-volatile semiconductor memory device according to claim 11, wherein the first signal wirings and the second signal wirings are not arranged along the first direction in an interleaved manner.

18. A non-volatile semiconductor memory device comprising:
- a first memory string including first and second groups of memory cell transistors connected in series;
- first word lines electrically connected to the first group of the memory cell transistors, that are laminated together to form a staircase shape; and
- second word lines electrically connected to the second group of the memory cell transistors, that are laminated together to form a staircase shape,
- wherein the first and second word lines extend in the same direction, and oriented so that steps of the staircase shape are facing the same direction such that the first and second word lines are supplied with power from the same direction.

19. The non-volatile semiconductor memory device according to claim 18, further comprising:
- a second memory string including third and fourth groups of memory cell transistors connected in series, the third group of memory cell transistors sharing the second word lines with the second group of memory cell transistors; and
- third word lines electrically connected to the fourth group of the memory cell transistors, that are laminated together to form a staircase shape,
- wherein the third word lines extend in the same direction as the first and second word lines, and oriented so that steps of the staircase shape are facing the same direction as those of the first and second word lines such that the first, second, and third word lines are supplied with power from the same direction.

20. The non-volatile semiconductor memory device according to claim 19, further comprising:
- a third memory string including fifth and sixth groups of memory cell transistors connected in series, the fifth group of memory cell transistors sharing the third word lines with the fourth group of memory cell transistors; and
- fourth word lines for the sixth group of the memory cell transistors, that are laminated together to form a staircase shape,
- wherein the fourth word lines extend in the same direction as the first, second, and third word lines, and oriented so that steps of the staircase shape are facing the same direction as those of the first, second, and third word lines such that the first, second, third, and fourth word lines are supplied with power from the same direction.

* * * * *